US011594673B2

(12) United States Patent
Sato et al.

(10) Patent No.: US 11,594,673 B2
(45) Date of Patent: Feb. 28, 2023

(54) TWO TERMINAL SPIN ORBIT MEMORY DEVICES AND METHODS OF FABRICATION

(71) Applicant: Intel Corporation, Santa Clara, CA (US)

(72) Inventors: Noriyuki Sato, Hillsboro, OR (US);
Angeline Smith, Hillsboro, OR (US);
Tanay Gosavi, Hillsboro, OR (US);
Sasikanth Manipatruni, Portland, OR (US); Kaan Oguz, Portland, OR (US);
Kevin O'Brien, Portland, OR (US);
Benjamin Buford, Hillsboro, OR (US);
Tofizur Rahman, Portland, OR (US);
Rohan Patil, Hillsboro, OR (US);
Nafees Kabir, Portland, OR (US);
Michael Christenson, Santa Clara, CA (US); Ian Young, Portland, OR (US);
Hui Jae Yoo, Hillsboro, OR (US);
Christopher Wiegand, Portland, OR (US)

(73) Assignee: Intel Corporation, Santa Clara, CA (US)

(*) Notice: Subject to any disclaimer, the term of this patent is extended or adjusted under 35 U.S.C. 154(b) by 786 days.

(21) Appl. No.: 16/367,129

(22) Filed: Mar. 27, 2019

(65) Prior Publication Data
US 2020/0313075 A1    Oct. 1, 2020

(51) Int. Cl.
*H01F 10/32*    (2006.01)
*H01L 43/10*    (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ....... H01L 43/02; H01L 27/228; H01L 43/10; H01L 27/224; G11C 11/161; H01F 10/329; H01F 10/3286
See application file for complete search history.

(56) References Cited

U.S. PATENT DOCUMENTS 5,594,933 A    1/1997 Hayashi et al.
6,057,049 A    5/2000 Fuke et al.
(Continued)

FOREIGN PATENT DOCUMENTS

WO    2017052606    3/2017

*Primary Examiner* — David Vu
*Assistant Examiner* — Brandon C Fox
(74) *Attorney, Agent, or Firm* — Essential Patents Group, LLP

(57) ABSTRACT

A memory device includes a first electrode including a spin-orbit material, a magnetic junction on a portion of the first electrode and a first structure including a dielectric on a portion of the first electrode. The first structure has a first sidewall and a second sidewall opposite to the first sidewall. The memory device further includes a second structure on a portion of the first electrode, where the second structure has a sidewall adjacent to the second sidewall of the first structure. The memory device further includes a first conductive interconnect above and coupled with each of the magnetic junction and the second structure and a second conductive interconnect below and coupled with the first electrode, where the second conductive interconnect is laterally distant from the magnetic junction and the second structure.

20 Claims, 20 Drawing Sheets

(51) Int. Cl.
*G11C 11/16* (2006.01)
*H01L 43/02* (2006.01)
*H01L 27/22* (2006.01)
*H01L 43/12* (2006.01)
*H01F 41/34* (2006.01)

(52) U.S. Cl.
CPC ............ *H01L 27/228* (2013.01); *H01L 43/10* (2013.01); *H01F 10/3254* (2013.01); *H01F 10/3272* (2013.01); *H01F 10/3286* (2013.01); *H01F 41/34* (2013.01); *H01L 43/12* (2013.01)

(56) References Cited

U.S. PATENT DOCUMENTS

| | | |
|---|---|---|
| 6,965,138 B2 | 11/2005 | Nakajima et al. |
| 7,098,495 B2 | 8/2006 | Sun et al. |
| 7,538,402 B2 | 5/2009 | Fukumoto |
| 8,159,870 B2 | 4/2012 | Xia |
| 8,169,821 B1 | 5/2012 | Ranjan et al. |
| 8,476,722 B2 | 7/2013 | Lee |
| 9,251,883 B2 | 2/2016 | Wu et al. |
| 10,276,784 B1 | 4/2019 | Yu et al. |
| 10,283,701 B1 | 5/2019 | Ikhtiar et al. |
| 10,497,417 B2 * | 12/2019 | Sasaki ...................... H01L 43/02 |
| 10,522,740 B2 | 12/2019 | Chuang et al. |
| 2004/0150017 A1 | 8/2004 | Tsang |
| 2004/0211963 A1 | 10/2004 | Garni et al. |
| 2005/0174836 A1 | 8/2005 | Sharma et al. |
| 2005/0247964 A1 | 11/2005 | Pietambaram et al. |
| 2005/0275000 A1 * | 12/2005 | Kajiyama ............... B82Y 10/00 257/E27.005 |
| 2007/0063237 A1 | 3/2007 | Huai et al. |
| 2007/0183187 A1 | 8/2007 | Guo |
| 2008/0273375 A1 | 11/2008 | Dahmani et al. |
| 2009/0039879 A1 | 2/2009 | Dieny |
| 2009/0166773 A1 | 7/2009 | Ohno et al. |
| 2010/0244163 A1 | 9/2010 | Daibou et al. |
| 2011/0075476 A1 | 3/2011 | Kajiwara et al. |
| 2012/0126905 A1 | 5/2012 | Zhang et al. |
| 2012/0163070 A1 | 6/2012 | Nagase et al. |
| 2013/0001506 A1 | 1/2013 | Sato et al. |
| 2013/0001652 A1 | 1/2013 | Yoshikawa et al. |
| 2013/0099780 A1 | 4/2013 | Ma et al. |
| 2014/0021426 A1 | 1/2014 | Lee et al. |
| 2014/0056060 A1 | 2/2014 | Khvalkovskiy et al. |
| 2014/0084398 A1 | 3/2014 | Oguz et al. |
| 2014/0084938 A1 | 3/2014 | Lai et al. |
| 2014/0145792 A1 | 5/2014 | Wang et al. |
| 2014/0169085 A1 | 6/2014 | Wang et al. |
| 2014/0269035 A1 | 9/2014 | Manipatruni et al. |
| 2014/0306302 A1 | 10/2014 | Guenole et al. |
| 2015/0035095 A1 | 2/2015 | Kim et al. |
| 2015/0061020 A1 | 3/2015 | Yokoyama et al. |
| 2015/0171316 A1 | 6/2015 | Park et al. |
| 2015/0171321 A1 | 6/2015 | Chan et al. |
| 2016/0079518 A1 | 3/2016 | Pi et al. |
| 2016/0163965 A1 | 6/2016 | Han et al. |
| 2016/0225423 A1 | 8/2016 | Naik et al. |
| 2017/0148978 A1 | 5/2017 | Apalkov et al. |
| 2018/0083067 A1 | 3/2018 | Kim et al. |
| 2018/0114898 A1 | 4/2018 | Lee |
| 2018/0123028 A1 | 5/2018 | Shiokawa et al. |
| 2018/0158588 A1 | 6/2018 | Manipatruni et al. |
| 2018/0197589 A1 | 7/2018 | Tang et al. |
| 2018/0219152 A1 | 8/2018 | Apalkov et al. |
| 2018/0248114 A1 | 8/2018 | Oguz et al. |
| 2018/0248115 A1 | 8/2018 | Oguz et al. |
| 2018/0358065 A1 | 12/2018 | Hu et al. |
| 2018/0374526 A1 | 12/2018 | Lee et al. |
| 2019/0057731 A1 | 2/2019 | Lua et al. |
| 2019/0081234 A1 | 3/2019 | Naik et al. |
| 2019/0244651 A1 | 8/2019 | Shiokawa et al. |
| 2019/0287589 A1 | 9/2019 | Buyandalai et al. |
| 2019/0304524 A1 | 10/2019 | Oguz et al. |
| 2019/0304653 A1 | 10/2019 | Oguz et al. |
| 2019/0305216 A1 | 10/2019 | Gosavi et al. |
| 2019/0386209 A1 | 12/2019 | Smith et al. |
| 2019/0386662 A1 | 12/2019 | Lin et al. |
| 2020/0006424 A1 | 1/2020 | Sato et al. |
| 2020/0006626 A1 * | 1/2020 | Smith ...................... H01L 43/02 |
| 2020/0235289 A1 * | 7/2020 | Alam ...................... H01L 43/02 |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0303981 A1 | 9/2021 | Sasaki et al. |
| 2021/0367142 A1 * | 11/2021 | Lee ...................... G11C 11/1673 |
| 2022/0068538 A1 * | 3/2022 | Apalkov ............... H01F 10/3286 |
| 2022/0131067 A1 * | 4/2022 | Kalitsov ................. H01L 43/02 |

\* cited by examiner

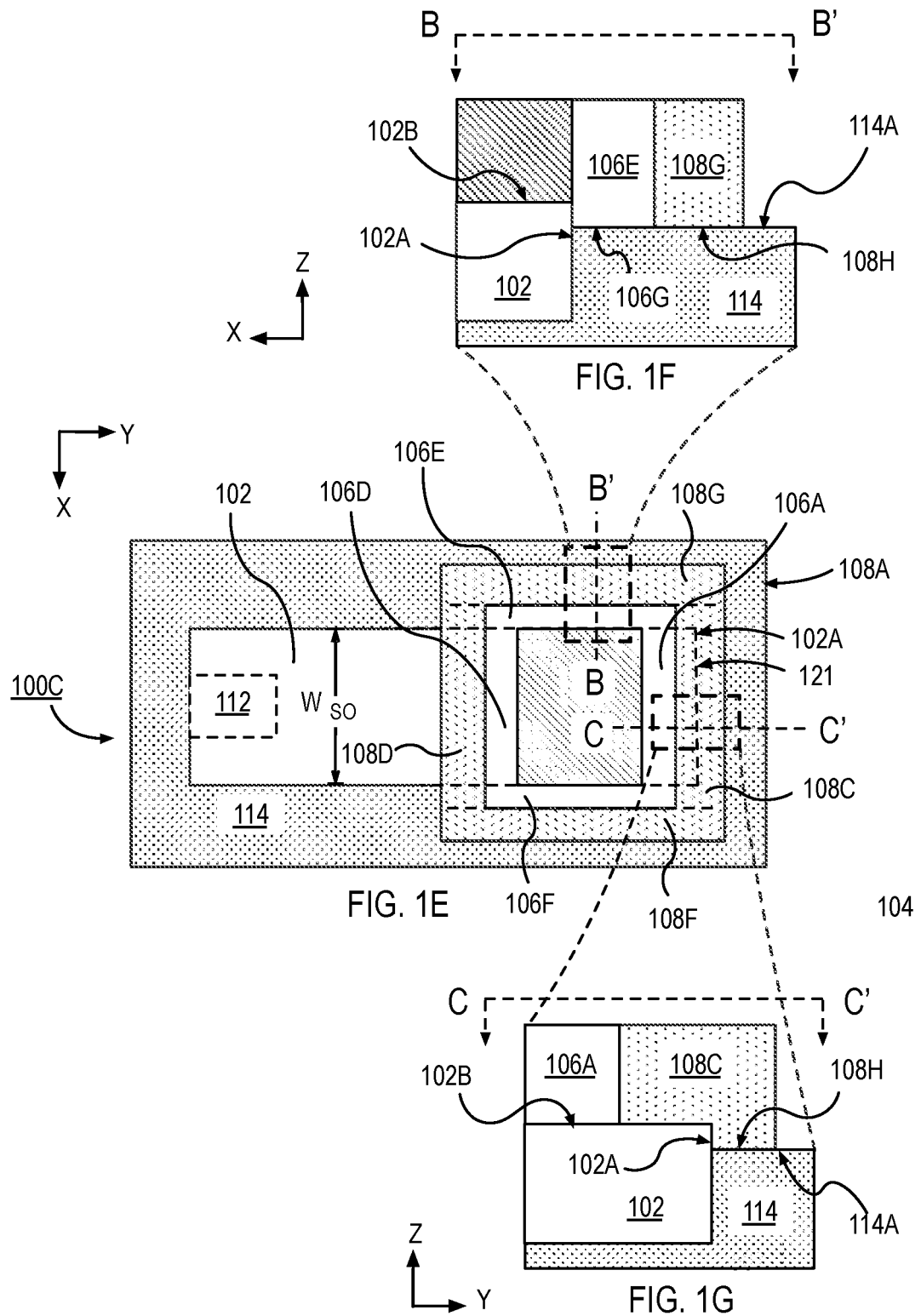

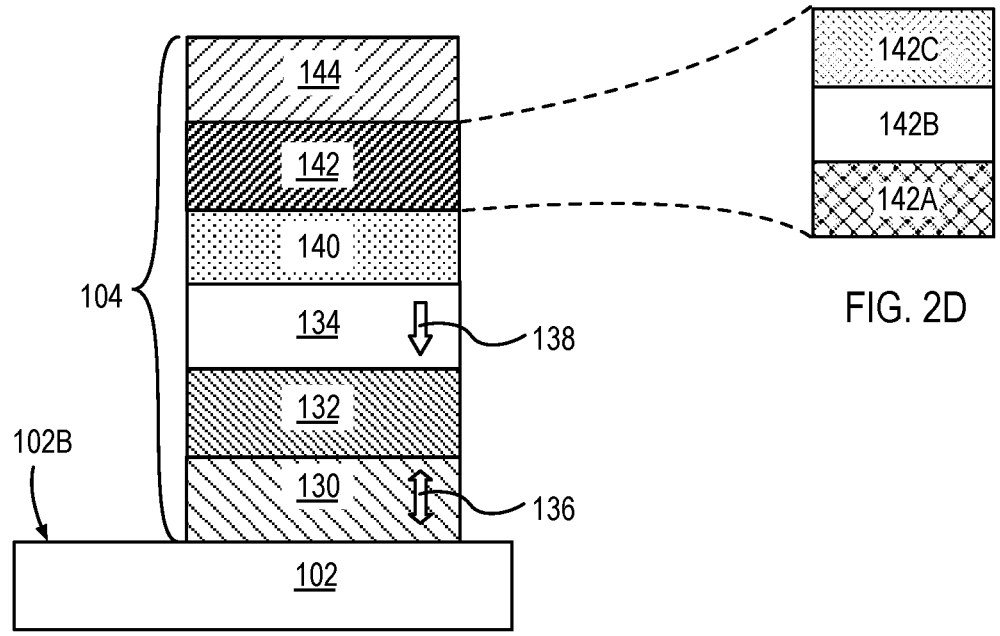
FIG. 2A
FIG. 2D
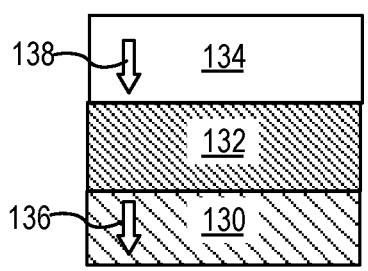
FIG. 2B
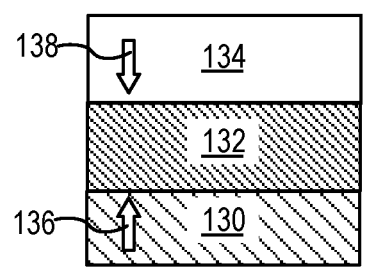
FIG. 2C
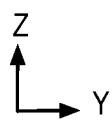

TWO TERMINAL SPIN ORBIT MEMORY DEVICES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit memory devices including a spin orbit electrode coupled with a compatible Magnetic Tunnel Junction (MTJ) device to overcome the requirements imposed by scaling.

Embedded memory including non-volatile memory devices, e.g., on-chip embedded memory with non-volatility can enable energy and computational efficiency. However, for efficiency, a high density of memory device is desirable. A non-volatile memory device such as magnetic tunnel junction (MTJ) memory may be coupled with a selector element on a spin orbit electrode to form a two terminal memory cell. A large collection of two terminal memory cells can increase density of a non-volatile embedded memory array.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1E illustrates a plan view of an MTJ having a rectangular view profile on a spin orbit electrode and a selector element having a first portion on a spin orbit electrode and a second portion over a dielectric adjacent to the spin orbit electrode, in accordance with an embodiment of the present disclosure.

FIG. 1F illustrates a cross-sectional view of a portion of the MTJ, the selector element and the spin orbit electrode.

FIG. 1G illustrates a cross-sectional view of a portion of the pMTJ, the selector element and the spin orbit electrode orthogonal to the cross-sectional illustration of FIG. 1F.

FIG. 2A illustrates a plan view of a memory device including an MTJ on a spin orbit electrode, in accordance with an embodiment of the present disclosure.

FIG. 2B illustrates a magnetic tunnel junction device in a high resistance state.

FIG. 2C illustrates a magnetic tunnel junction device in a low resistance state.

FIG. 2D illustrates a cross-sectional view of layers in a synthetic antiferromagnet (SAF) structure, in accordance with an embodiment of the present disclosure

DESCRIPTION OF THE EMBODIMENTS

Figure 1A:
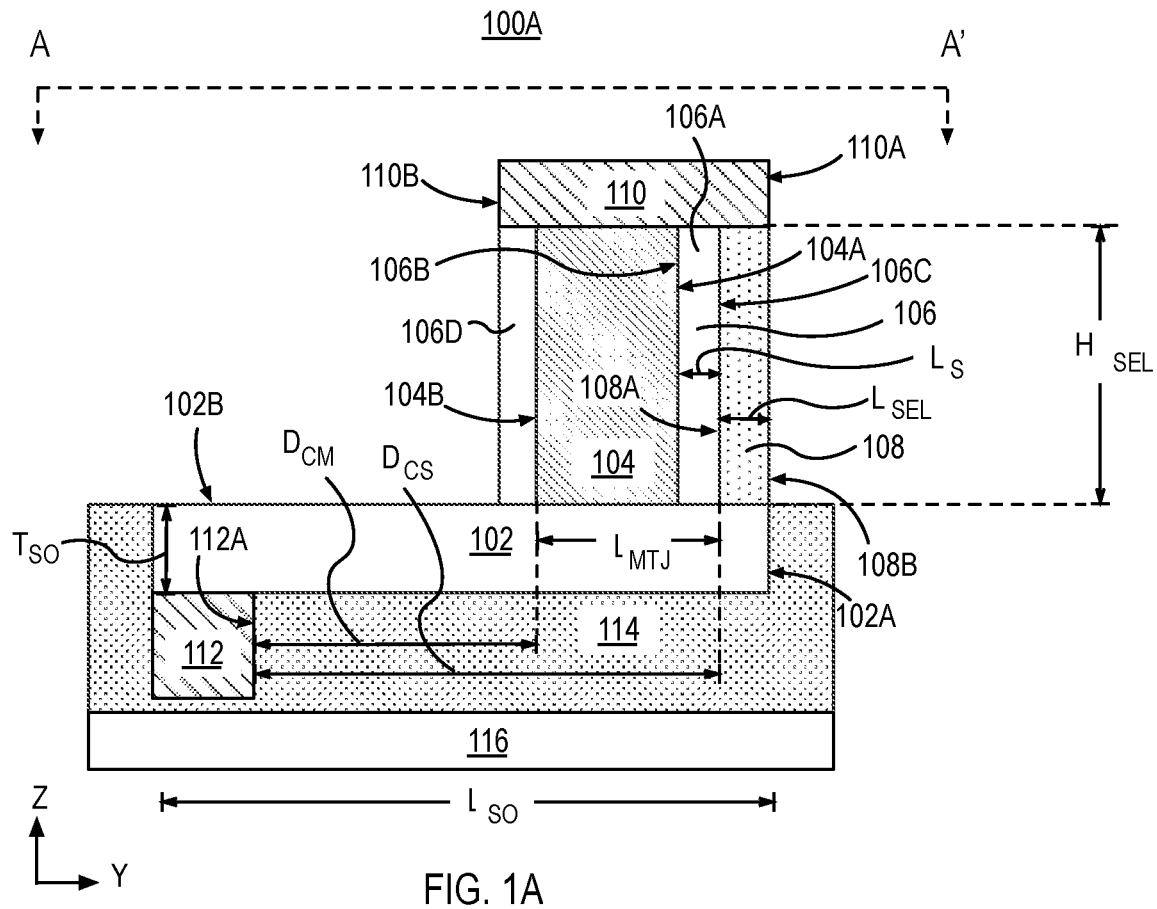
FIG. 1A illustrates a cross-sectional view of a spin orbit memory device including a magnetic tunnel junction (MTJ) and a selector element on a spin orbit electrode, in accordance with an embodiment of the present disclosure.

Two terminal spin orbit memory devices for high density applications and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, magnetic or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In an embodiment, a spin orbit memory device includes a magnetic tunnel junction (MTJ) formed on an electrode including a spin orbit material, herein a spin orbit electrode. The MTJ functions as a memory device where the resistance of the MTJ switches between a high resistance state and a low resistance state. The resistance state of an MTJ is defined by the relative orientation of magnetization between a free magnet and a fixed magnet that are separated by a tunnel barrier. When the magnetization of the free magnet and a fixed magnet have orientations that are in the same direction, the MTJ is said to be in a low resistance state. Conversely, when the magnetization of the free magnet and a fixed magnet each have orientations that are in opposite direction to each other, the MTJ is said to be in a high resistance state.

As MTJs are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a plane of the free magnet. Resistance switching is brought about in a pMTJ by passing a critical amount of spin polarized current through the pMTJ so as to influence an orientation of a magnetization in the free magnet to align with a magnetization in the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ is retained even when there is no current flowing through the pMTJ device. For this reason, the pMTJ belongs to a class of memory known as non-volatile memory.

As a pMTJ is further scaled down in size, the amount of critical spin polarized current density required to switch the device increases. By implementing a pMTJ on a spin orbit electrode, the magnetization in the free magnet can switch direction with an assistance of torque provided by a spin Hall current. The spin Hall current may be induced by passing an electrical current in a transverse direction, through the spin orbit electrode. The spin Hall current arises from spin dependent scattering of electrons due to a phenomenon known as spin orbit interaction. Electrons of one spin polarity are directed towards an upper portion of the spin orbit electrode and electrons with an opposite spin polarity are directed toward a bottom portion of the spin orbit electrode. Electrons of a particular spin polarity diffuse toward a free magnet of the pMTJ device (the layer within the pMTJ device that is contact with the spin orbit electrode) and impart a spin orbit torque on the magnetization of the free magnet.

While benefiting from spin Hall Current, a spin orbit memory device utilizes three terminals for operation. The three terminals may be coupled with two different transistors for enabling read/write and erase operations. Two of the three terminals are connected to two opposite portions of the spin orbit electrode. The remaining third terminal is connected to a top portion of the pMTJ that is opposite to a free magnet. In an embodiment, a spin orbit memory device utilizes a first access transistor to select a memory cell to be read, and a second access transistor to program (write/erase) the memory cell. Presence of two transistors and can increase a memory cell footprint.

In an embodiment, the memory cell footprint can be reduced when a two terminal selector element is in electrical contact with the spin orbit memory device but separated from a pMTJ by an ultra-thin dielectric spacer. In such an embodiment, a first terminal of the two terminal selector and the free magnet pMTJ are both coupled to the spin orbit electrode, and a second terminal of the two terminal selector and the portion of the pMTJ that is opposite to the free magnet are coupled to a common electrode structure. The common electrode structure represents one terminal of the spin orbit memory device. A metallization structure is coupled to one end of the spin orbit memory device that is laterally distant from the pMTJ and the selector. The metallization structure represents a second terminal of the spin orbit memory device. To generate spin Hall current the metallization structure is laterally distant from the pMTJ and the two-terminal selector by a distance that is at least larger than a few nm.

A two terminal selector changes from a non-conductive or insulating state to a conductive state, when a voltage greater than a threshold voltage, $V_T$, is applied, for example between the common electrode and the metallization structure. In an embodiment, $V_T$ is less than or equal to 0.6V. A threshold selector with a $V_T$ less than or equal to 0.6V may be utilized with a pMTJ device that operates at approximately 1V. In other embodiments, when a pMTJ device operates at a higher voltage then a threshold selector that has a $V_T$ is less than or equal to 4V may be utilized.

By applying a voltage greater than $V_T$ but less than a switching voltage of a pMTJ, the resistance state of pMTJ can be switched. Thus, the spin orbit memory device can be programmed without a need for a second transistor. The size of the memory cell can be reduced when a second transistor is absent. A reduced cell size may provide more valuable space on the chip for increasing density of memory cells as well as for other components such as a periphery sensing circuitry for SOC applications.

FIG. 1A is an illustration of a cross-sectional view of a memory device 100A, in accordance with an embodiment of the present disclosure. In the illustrative embodiment, the memory device 100A is a spin orbit memory device 100. The spin orbit memory device 100A includes an electrode 102 having a spin orbit material. The electrode 102 is herein referred to as a spin orbit electrode 102. The spin orbit memory device 100A further includes a magnetic junction 104 on a portion of the spin orbit electrode 102 and a first structure 106 including a dielectric (herein spacer 106) on a portion of the spin orbit electrode 102. Spacer portion 106A has a first sidewall 106B and a second sidewall 106C opposite to the first sidewall 106B. The first sidewall 106B is adjacent to a sidewall 104A of the magnetic junction 104. The spin orbit memory device 100A further includes a second structure 108 (herein selector element 108) on a portion of the spin orbit electrode 102. The selector element 108 has a sidewall 108A adjacent to the sidewall 106C. A conductive interconnect 110 is coupled with each of the magnetic junction 104 and the selector element 108. A second conductive interconnect 112 is coupled with the spin orbit electrode 102. The conductive interconnect 112 is adjacent to a dielectric 114 above a substrate 116. The conductive interconnect 112 is laterally distant from a sidewall 104B of the magnetic junction 104 by a distance, $D_{CM}$. For a spin Hall current to be generated in the spin orbit electrode 102, $D_{CM}$ is at least 2 nm. In an embodiment, $D_{CM}$ is between 2 nm and 400 nm.

As shown the spin orbit electrode 102 has a lateral thickness, $L_{SO}$ (along the Y direction) and a thickness, $T_{SO}$ (along the Z-direction). $L_{SO}$ is between 30 nm and 500 nm. $T_{SO}$ is between 2 nm and 10 nm. $L_{SO}$ has a lateral thickness, that is greater than a combined lateral thickness of the magnetic junction 104, the spacer 106 and the selector element 108.

In the illustrative embodiment, the magnetic junction 104 is a magnetic tunnel junction (MTJ) 104. The MTJ 104 may be an in-plane MTJ or a perpendicular MTJ. The magnetic tunnel junction 104 has a lateral thickness, LMTJ (along the Y direction as shown). LMTJ is between 10 nm and 50 nm. In the illustrative embodiment, the sidewall 104A of the MTJ 104 does not extend beyond a sidewall 102A of the spin orbit electrode 102. The spacer 106 has a lateral thickness, $L_S$ (along the Y direction as shown). $L_S$ is between 2 nm and 50 nm as measured from the sidewall 104A. In the illustrative embodiment, the spacer 106 includes a spacer portion 106D adjacent to sidewall 104B. In an embodiment, the spacer portion 106D has a same or substantially the same lateral thickness, $L_S$ as the spacer portion 106A adjacent to sidewall 104A.

The selector element 108 has a lateral thickness, $L_{SEL}$ as measured along the Y direction from the sidewall 106B of the spacer 106. $L_{SEL}$ is between 5 nm and 50 nm as measured from the sidewall 106C. In the illustrative embodiment, selector element 108 has a sidewall 108B that is aligned with the sidewall 102A. A lateral separation between selector element 108 and the conductive interconnect 112 defines a shortest current path, between the conductive interconnect 112 and the selector element 108, in the spin orbit electrode 102. As shown, sidewall 108A of the selector element 108 and sidewall 112A of the conductive interconnect 112 are laterally separated by a distance, $D_{CS}$. In the illustrative embodiment, $D_{CS}$ is the shortest current path between the selector element 108 and the conductive interconnect 112 in the spin orbit electrode 102.

The selector element 108 has a height, $H_{SEL}$, (as measured from a top surface 102B of the spin orbit electrode 102 that is the same or substantially the same as a height, $H_{MTJ}$, of the MTJ 104. The height, $H_{MTJ}$ is determined by a combined thickness of constituent layers in the MTJ 104 as will be discussed further below.

As shown sidewalls 104A, 104B, 106B, 106C, 108A and 108B are vertical or substantially vertical. In other embodiments, the sidewalls 104A, 104B, 106B, 106C, 108A and 108B are tapered. The taper may be up to 10 degrees with respect to a vertical axis. In some such embodiments, the selector element 108 has a lateral thickness at an interface between the selector element 108 and the spin orbit electrode 102 that is greater than a lateral thickness at an interface between the selector element 108 and the conductive interconnect 110. In some embodiments, conductive interconnect 110 has a sidewall 110A that laterally extends beyond selector sidewall 108B and a sidewall 110B that laterally extends beyond the dielectric spacer portion 106D.

The spin orbit electrode 102 includes a metal with high degree of spin orbit coupling. A metal with a high degree of spin-orbit coupling has an ability to inject a large spin polarized current in to the magnetic junction 104. In an embodiment, the spin orbit electrode 102 includes one or more of tantalum, tungsten, platinum or gadolinium, β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In an embodiment, SOT layer including tungsten, tantalum or copper can be doped with Co, Fe, Ni, MnGa, MnGeGa, Bct-Ru, Gd or Tb. A spin orbit electrode 102 including a beta phase tantalum or beta phase tungsten has a high spin hall efficiency. A high spin hall efficiency denotes that the spin orbit electrode 102 can generate a large spin hall current for a given charge current that is passed through the spin orbit electrode 102.

The spacer 106 includes a dielectric material. The spacer 106 provides electrical insulation between sidewall 104A of the MTJ 104 and the selector element 108. In an embodiment, the spacer 106 includes silicon and at least one of oxygen, carbon or nitrogen. The dielectric 114 may also include silicon and one or more of oxygen, carbon or nitrogen. In an embodiment, the dielectric layer 114 and the spacer 106 include different materials.

The selector element 108 includes an insulator-metal transition (IMT) oxide. In an embodiment, the insulator-metal transition (IMT) oxide includes oxygen and one of Va, Hf, TaHf, Ti, HfTi, HfNi, HfNb, TaNb, Ni, PCMO, LSMO, InZn, IGZO. In an embodiment, the selector element 108 includes one of oxygen and Hf or Ta that is doped with Cu, Ag, Au, Ta. The doping concentration may range between 1%-10%.

In an embodiment, the conductive interconnect 112 includes a barrier layer, such as tantalum nitride, and a fill metal, such as copper, tungsten or ruthenium. The conductive interconnect 110 may include a material such as W, Ta, Ir, Bi, TaN or Hf. In other embodiments, the conductive interconnect 110 may include a barrier layer such as Ta, Ru, and a fill layer such as Cu, Ni, Co or Pt.

In an embodiment, the substrate 116 includes a suitable semiconductor material such as but not limited to, single crystal silicon, polycrystalline silicon and silicon on insulator (SOI). In another embodiment, substrate 116 includes other semiconductor materials such as germanium, silicon germanium or a suitable group III-N or a group III-V compound. Logic devices such as MOSFET transistors and access transistors and may be formed on the substrate 116. Logic devices such as access transistors may be integrated with memory devices such as spin orbit memory device to form embedded memory. Embedded memory including spin orbit memory devices and a logic MOSFET transistors may be combined to form functional integrated circuit such as a system on chip.

Figure 1B:
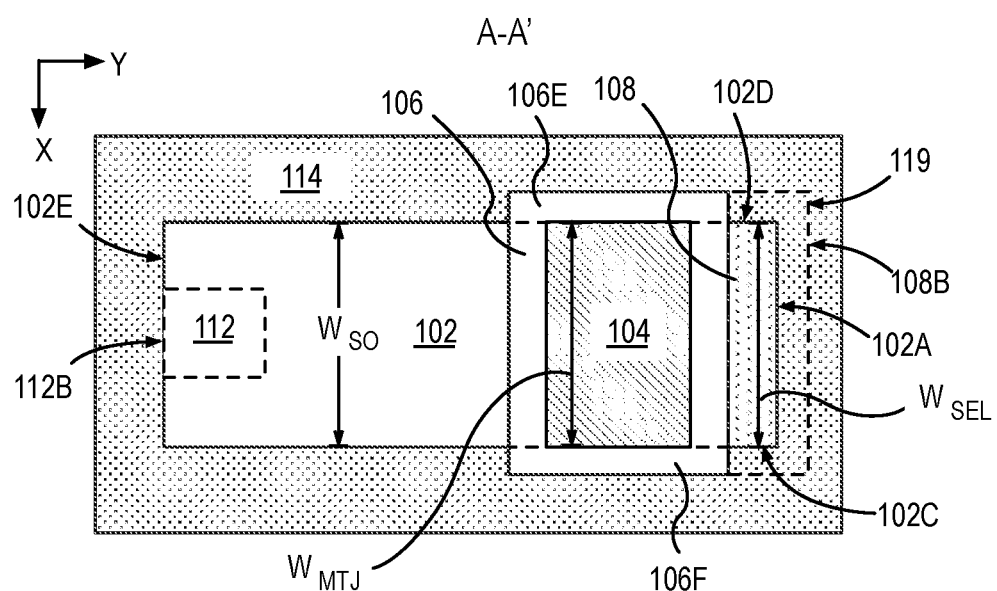
FIG. 1B illustrates a plan view of an MTJ and a selector element on a spin orbit electrode, in accordance with an embodiment of the present disclosure.

FIG. 1B illustrates a plan view of MTJ 104, selector element 108 and the spin orbit electrode 102, in accordance with an embodiment of the present disclosure. The conductive interconnect 110 is not illustrated to provide clarity. As shown the selector element 108 is confined to a portion of the spin orbit electrode 102. The spin orbit electrode 102 has a width, $W_{SO}$, and the selector element 108 has a width $W_{SEL}$ (along the X direction, as shown). In the illustrative embodiment, $W_{SO}$ is the same or substantially the same as $W_{SEL}$.

In an embodiment, sidewall 108B of selector element 108 may extend laterally beyond the sidewall 102A as indicated by dashed line 119. In one such embodiment, selector 108 extends laterally on to the dielectric 114 adjacent to the spin orbit electrode 102. In an embodiment, the selector element 108 overlaps with the spin orbit electrode 102 by at least 2 nm to provide electrical conductivity. The selector element 108 may also extend beyond sidewall 102D of the spin orbit electrode 102 (as indicated by dashed lines). Likewise, selector element 108 may also extend beyond sidewall 102C of the spin orbit electrode 102 (as indicated by dashed line 119). The selector element 108 need not be symmetric about the spin orbit electrode 102. For example, selector element 108 may extend beyond sidewall 102C and beyond sidewall 102D by unequal amounts. In other embodiments, the selector element 108 has a plurality of portions that are on the spin orbit electrode 102 as will be discussed further below.

The size of the MTJ 104 relative to the spin orbit electrode 102 is shown in the plan view illustration in FIG. 1B. The MTJ 104 has a width $W_{MTJ}$. In the illustrative embodiment, $W_{MTJ}$, is the same or substantially the same as $W_{SO}$. In the illustrative embodiment, the spacer 106 laterally surrounds the MTJ 104. As shown, the spacer portions 106E and 106F extend on to the dielectric 114. In some examples, the spacer 106 may have a uniform lateral thickness, $L_S$, around the MTJ 104, as shown.

As illustrated, conductive interconnect 112 (inside dashed lines) is confined within boundaries of the spin orbit electrode 102 (for processing advantages). In an embodiment, a sidewall 112B of the conductive interconnect 112 is aligned with a sidewall 102E. In some embodiments, sidewall 112B may extend beyond sidewall 102E.

Figure 1C:
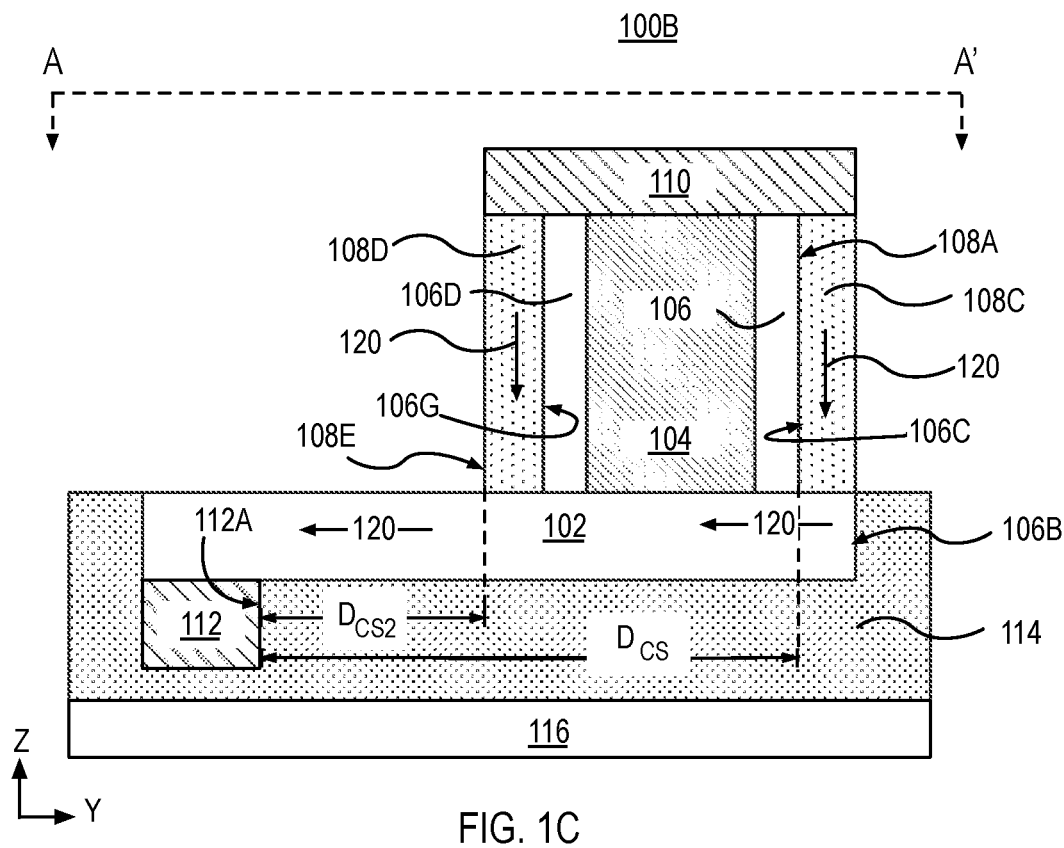
FIG. 1C illustrates a cross-sectional view of a spin orbit memory device including a magnetic tunnel junction (MTJ) and a selector element coupled on a spin orbit electrode, in accordance with an embodiment of the present disclosure.

FIG. 1C illustrates a cross-sectional view of a spin orbit memory device 100B including an MTJ 104 and a selector element 108 along a direction A-A'. The selector element 108 includes a first selector element portion 108C on the spin orbit electrode 102 adjacent to sidewall 106C. The selector element 108 also includes a second selector element portion 108D on the spin orbit electrode 102 adjacent to spacer sidewall 106G. As shown, sidewall 108E of the selector element portion 108D and sidewall 112A of the conductive interconnect 112 are laterally separated by a distance, $D_{CS2}$. As shown, since $D_{CS2}$ is less than $D_{CS}$, $D_{CS2}$ provides a shortest current path between the selector element 108 and the conductive interconnect 112 in the spin orbit electrode 102. When conductive interconnect 110 is voltage biased relative to conductive interconnect 112, a charge current 120 flows through the selector 108. A portion of charge current 120 travels through the selector portion 108C into the spin orbit electrode and towards the conductive interconnect 112, generating a spin Hall current in the spin orbit electrode 102.

Figure 1D:
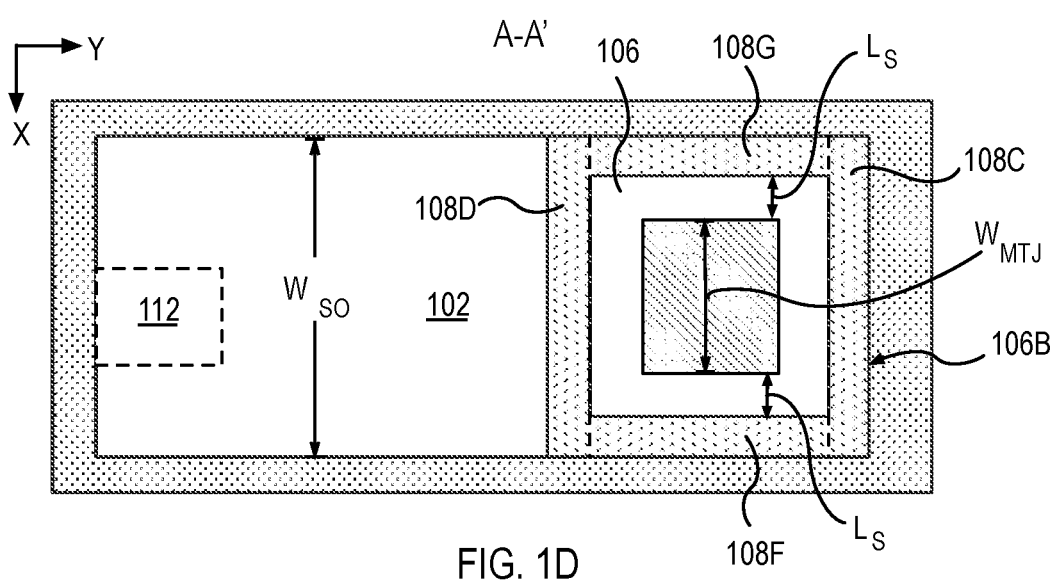
FIG. 1D illustrates a plan view of an MTJ and a selector element on a spin orbit electrode, in accordance with an embodiment of the present disclosure.

As shown in the plan view illustration of FIG. 1D, selector element portions 108D and 108C are connected by selector element portion 108F and selector element portion 108G, respectively. As shown, selector element 108 laterally surrounds spacer 106. In the illustrative embodiment, the selector element 108 is confined to the spin orbit electrode 102.

In the illustrative embodiment, MTJ 104 has a width, $W_{MTJ}$ that is less than a width of the spin orbit electrode 102, $W_{SO}$. In one such embodiment, the spacer 106 has a lateral thickness, $L_S$, in the X-direction that is sufficiently thin such that the selector element portions 108F and 108G are confined on spin orbit electrode 102. In other embodiments, when an MTJ 104 has a width, $W_{MTJ}$ is substantially equal to $W_{SO}$, the selector element 108 will extend over the dielectric 114.

FIG. 1E illustrates a plan view of a memory device 100C illustrated in FIG. 1A, where selector element 108 laterally surrounds the spacer 106. In the illustrative embodiment, MTJ 104 has a width, $W_{MTJ}$ that is substantially equal to a width of the spin orbit electrode 102, $W_{SO}$. As shown, spacer 106 laterally surrounds the MTJ 104, where portions of the spacer 106 are on the spin orbit electrode 102 and portions are on the dielectric 114.

In the illustrative embodiment, selector element 108 has two selector element portions 108C and 108D that are on the spin orbit electrode 102 and two selector element portions 108F and 108G that are not on the spin orbit electrode 102. Selector element portion 108C is partially on the spin orbit electrode 102 and partially on the dielectric 114. Sidewall 108A extends beyond sidewall 102A of the spin orbit electrode 102. An outline of a portion of the spin orbit electrode 102 is indicated by the dashed line 121.

A portion of a cross section through a line B-B' is illustrated in the cross-sectional illustration in FIG. 1F. In the illustrative embodiment, dielectric 114 has an uppermost surface 114A that is recessed below an uppermost surface 102B of the spin orbit electrode 102. In the illustrative embodiment, the spacer portion 106G is on the dielectric 114. As shown, spacer portion 106E has a lowermost surface 106G that is recessed below the uppermost surface of the spin orbit electrode 102. In an embodiment, selector element portion 108G has a lowermost surface 108H that is below the uppermost surface 102B of the spin orbit electrode 102, as shown. In other embodiments, surfaces 114A, 102B, 106G and 108H are co-planar or substantially co-planar.

A portion of a cross section through a line C-C' in FIG. 1E is illustrated in the cross-sectional illustration in FIG. 1G. In the illustrative embodiment, dielectric 114 has an uppermost surface 114A that is recessed below an uppermost surface 102B of the spin orbit electrode 102. In the illustrative embodiment, the spacer portion 106A is on and does not extend beyond the spin orbit electrode 102. Along the line C-C', the selector element portion 108C has a section that is on the spin orbit electrode 102 and a lowermost surface 108H that is below the uppermost surface 102B of the spin orbit electrode 102, as shown. In other embodiments, surfaces 114A, 102B and 108H are co-planar or substantially co-planar.

Referring again to FIG. 1E, in some embodiments, where selector element 108 has multiple portions, it is desirable for a single selector element portion such as selector element portion 108C to be in contact with the spin orbit electrode 102. In some such embodiments, it is desirable for the selector element portion 108D to be isolated from the spin orbit electrode 102.

Figure 1H:
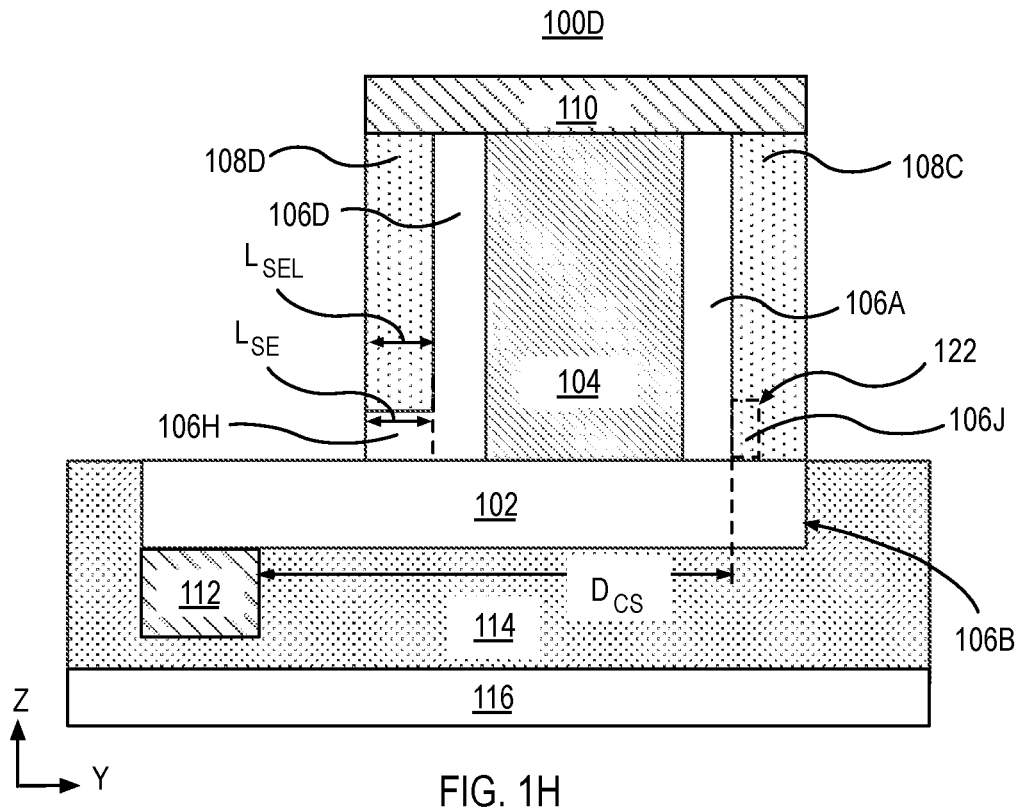
FIG. 1H illustrates a cross-sectional view of a spin orbit memory device where a portion of a selector element is uncoupled from a spin orbit electrode, in accordance with an embodiment of the present disclosure.

FIG. 1H is a cross-sectional illustration in of a memory device 100D, where a selector portion 108D is isolated from the spin orbit electrode 102 and the selector portion 108C is in electrical contact with the spin orbit electrode 102. Such an arrangement is favorable to provide a large current path along the distance $D_{CS}$. In the illustrative embodiment, the spacer portion 106D has a lateral spacer extension 106H under the selector element portion 108D. The lateral spacer extension 106H may have a lateral thickness, $L_{SE}$, that is the same or substantially the same as the lateral thickness, $L_{SEL}$ of the selector portion 108D. In other embodiments, $L_{SE}$ is greater than $L_{SEL}$.

In some embodiments, spacer portion 106A also has a lateral spacer extension 106J, where the lateral spacer extension is not completely under the selector element. Dashed line 122 shown in FIG. 1H outlines a lateral spacer extension 106J in some such embodiments. As shown, selector element portion 108C has a section on the lateral spacer extension 106J and a section in contact with the spin orbit electrode 102. In other embodiments, the selector element portion 108C also extends onto the dielectric 114.

Figure 1I:
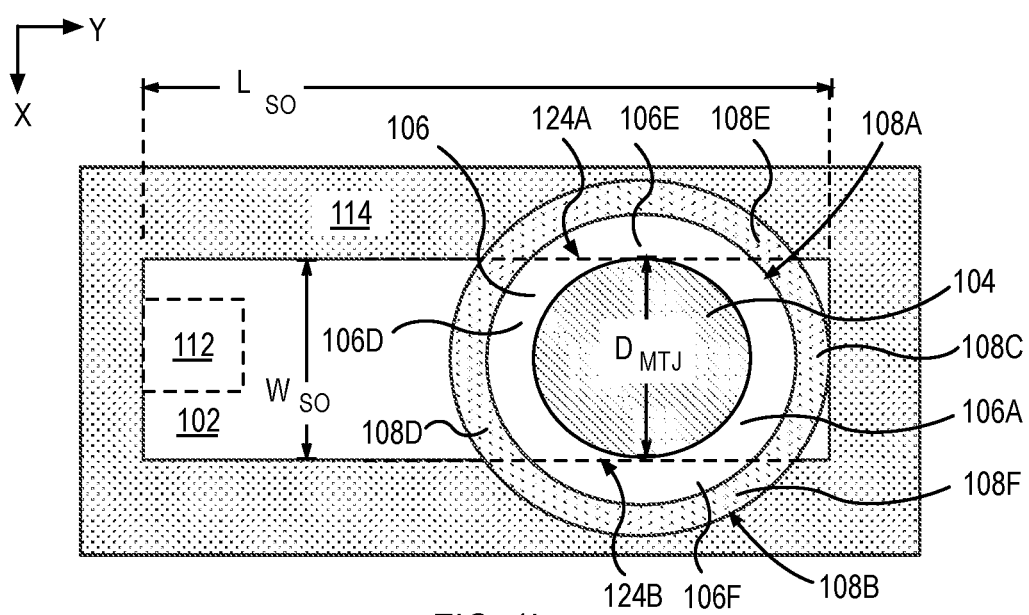
FIG. 1I illustrates a plan view of a pMTJ device having a circular plan view cross section and an annular selector element on a spin orbit electrode, in accordance with an embodiment of the present disclosure.

While the MTJ 104 has been depicted as having a rectangular or a square cross section, in other embodiments, the MTJ 104 has a circular plan-view section as shown in the plan-view illustration of FIG. 1I. As shown, MTJ 104 has a diameter, $D_{MTJ}$, that is the same or substantially the same as the lateral width, $W_{SO}$. Dashed lines 124A and 124B outline the boundaries of the spin orbit electrode 102 under the selector element 108 and the spacer 106.

In the illustrative embodiment, the spacer 106 is adjacent to MTJ 104 and has an annular shape. A spacer 106 having an annular shape has an unequal portion on the spin orbit electrode 102 compared to the dielectric 114. Spacer portions 106E and 106F are on the dielectric 114. Spacer portions 106A and 106D are on the spin orbit electrode 102. Spacer portions 106A and 106D have a larger plan view size than spacer portions 106E and 106F. The spacer 106 physically separates the MTJ 104 from to selector 108.

As shown, the selector element 108 is adjacent to the spacer 106 and also has an annular shape. A selector element 108 having an annular shape has an unequal portion on the spin orbit electrode 102 compared to on the dielectric 114. Selector element portions 108E and 108F are on the dielectric 114. Selector element portions 108C and 108D are on the spin orbit electrode 102. Selector element portions 108C and 108D have a smaller plan view size than selector element portions 108E and 108F.

In some embodiments, selector element portion 108D is in contact with the spin orbit electrode 102. In other embodiments, selector element portion 108D is not in contact with the spin orbit electrode where there is intervening lateral spacer extension between the selector element portion 108D and the spin orbit electrode 102 (such as is described in FIG. 1H). Referring again to FIG. 1I, in some embodiments, selector portions 108E and 108F may be absent. In other embodiments, only selector element portion 108C is present adjacent to spacer portion 106A.

In other embodiments, the selector 108 has an inner sidewall 108A that has a circular plan-view cross section, as shown, but the sidewall 108B has a rectangular plan view cross section (not shown).

FIG. 2A is an illustration of a cross sectional view of an MTJ 104 on the spin orbit electrode 102, in accordance with an embodiment of the present disclosure. The MTJ 104 includes a magnet 130, a layer 132 on the magnet 130, and a magnet 134 on the layer 132. The MTJ 104 further includes a non-magnetic spacer layer 140 above the fixed magnet 134, a SAF structure 142 on the spacer layer 140 and a top electrode 144 above the SAF structure 142. The non-magnetic spacer layer 140 ferromagnetically couples the first pinning ferromagnet 142A and the fixed magnet 134. In an embodiment, a non-magnetic spacer layer may include a metal such as Ta, or Ir to provide magnetic coupling. The top electrode 144 may include a material such as Ta, TaN or TiN. In an embodiment, the top electrode 144 has a thickness between 5 nm and 50 nm.

The magnet 130 has a magnetization 136 that may change orientation during operation. For example, magnetization 136 may orient in the positive or negative Z-direction as indicated by the bi-directional arrow. Such a magnet 130 is herein referred to as a free magnet 130. The direction of magnetization 136 is perpendicular to a plane of an uppermost surface 102B of the spin orbit electrode 102. The free magnet 130 having a magnetization 138 that is perpendicular to the plane of the uppermost surface 102B may also be known as a perpendicular free magnet 130.

The magnet 134 has a magnetization 138 that remains fixed during operation. For example, magnetization 138 may orient in the positive or in a negative Z-direction. In the illustrative embodiment, the magnetization 138 is parallel to magnetization 136 in the free magnet 130. Such a magnet 134 is herein referred to as a fixed magnet 134. The direction of magnetization 138 is perpendicular to a plane of an uppermost surface 102B of the spin orbit electrode 102. The fixed magnet 134 having a magnetization 138 that is perpendicular to the plane of the uppermost surface 102A may also be known as a perpendicular fixed magnet 134.

In the illustrative embodiment, the free magnet 130 includes a magnetic material such as Co, Ni, Fe or alloys of these materials. In an embodiment, the free magnet 130 includes a magnetic material such as CoB, FeB, CoFe or CoFeB. In some embodiments, the free magnet 130 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 130 is FeB, where the concentration of boron is between 10 and 40 atomic percent of the total composition of the FeB alloy. In an embodiment, free magnet 130 has a thickness in the range of 1 nm to 1.5 nm.

In the illustrative embodiment, the layer 132 is a tunnel barrier 132. In an embodiment, tunnel barrier 132 includes a material suitable for allowing electron current having a majority spin to pass through tunnel barrier 132, while impeding, at least to some extent, electron current having a minority spin from passing through tunnel barrier 132. Thus, tunnel barrier 132 (or spin filter layer) may also be referred to as a tunneling layer for electron current of a particular spin orientation. In an embodiment, tunnel barrier 132 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 132 including MgO has a crystal orientation that is (001) and is lattice matched to free magnet 130 below tunnel barrier 132 and fixed magnet 134 above tunnel barrier 132. In an embodiment, tunnel barrier 132 is MgO and has a thickness in the range of 1 nm to 3 nm. In an embodiment, a free magnet 130 including a $Co_{100-x-y}Fe_xB_y$, is highly lattice matched to the tunnel barrier 132 including an MgO. Lattice matching between a crystal structure of the free magnet 130 and the tunnel barrier 132 enables a higher tunneling magnetoresistance (TMR) ratio in the MTJ 104.

In some embodiments, the fixed magnet 134 includes a material and has a thickness sufficient for maintaining a fixed magnetization. In an embodiment, the fixed magnet 134 of the pMTJ device 104 includes an alloy such as CoFe or CoFeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Molybdenum to promote high perpendicular anisotropy. In an embodiment, the fixed magnet 134 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 134 is FeB, where the concentration of boron is between 10 and 40 atomic percent of the total composition of the FeB alloy. In an embodiment the fixed magnet 134 has a thickness that is between 1 nm and 2 nm.

FIG. 2B illustrates a cross-sectional view depicting the free magnet 130 of the MTJ device 104 having a direction of magnetization (denoted by the direction of the arrow 136) that is anti-parallel to a direction of magnetization (denoted by the direction of the arrow 138) in the fixed magnet 134. When the direction of magnetization 136 in the free magnet 130 is opposite (anti-parallel) to the direction of magnetization 138 in the fixed magnet 134, the MTJ device 104 device is said to be in a high resistance state.

Conversely, FIG. 2C illustrates a cross-sectional view depicting the free magnet 130 of the MTJ device 104 having a direction of magnetization (denoted by the direction of the arrow 136) that is parallel to a direction of magnetization (denoted by the direction of the arrow 138) in the fixed magnet 134. When the direction of magnetization 136 in the free magnet 130 is parallel to the direction of magnetization 138 in the fixed magnet 134, the MTJ device 104 is said to be in a low resistance state.

In an embodiment, the free magnet 130 and the fixed magnet 134 can have approximately similar thicknesses and an injected spin polarized current which changes the direction of the magnetization 136 in the free magnet 130 can also affect the magnetization 138 of the fixed magnet 134. In an embodiment, to make the fixed magnet 134 more resistant to accidental flipping the fixed magnet 134 has a higher magnetic anisotropy than the free magnet structure 106. To reduce the stray field acting on the free magnet 134 a synthetic antiferromagnetic (SAF) structure 142 may be utilized.

FIG. 2D illustrates a cross-sectional view of the SAF structure 142, in an accordance of an embodiment of the present disclosure. In an embodiment, the SAF structure 142 includes a non-magnetic layer 142B sandwiched between a first pinning ferromagnet 142A and a second pinning ferromagnet 142C as depicted in FIG. 1D. The first pinning ferromagnet 142A and the second pinning ferromagnet 142C are anti-ferromagnetically coupled to each other. The pinning ferromagnets 142A, 142C may be designed to have high coercive fields and a high degree of perpendicular magnetic anisotropy. In an embodiment, the first pinning ferromagnet 142A includes a layer of a magnetic metal such as Co, Ni, Fe, or alloys of magnetic metals such as Co, Ni, Fe, alloys such as Co—Pd, Cp-Pt, Co—W or Co—Mo. In other embodiments the first pinning ferromagnet 142A includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in first pinning ferromagnet 142A may range between 2 and 6. In an embodiment, the second pinning ferromagnet 142C includes a layer of a magnetic metal such as Co, Ni, Fe, or alloys of magnetic metals such as Co, Ni, Fe, alloys such as Co—Pd, Cp-Pt, Co—W or Co—Mo. In other embodiments the second pinning ferromagnet 142C includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in second pinning ferromagnet 142B may range between 6 and 10.

In an embodiment, the non-magnetic layer 142B includes a ruthenium or an iridium layer. In an embodiment, a ruthenium based non-magnetic layer 142B has a thickness between 0.3-1.0 nm to ensure that the coupling between the first pinning ferromagnet 142A and the second pinning ferromagnet 142C is anti-ferromagnetic (AF).

While the various embodiments here are illustrated with reference to an MTJ device 104 on a spin orbit electrode 102, the embodiments are also applicable to spin valves. In an embodiment, a spin valve device includes a layer 132 that is a metal oxide or a metal between the free magnet 130 and fixed magnet 134, instead of a tunneling dielectric MgO.

FIGS. 3A-3D illustrate a mechanism for switching a spin orbit memory device such as the spin orbit memory device 100.

Figure 3A:
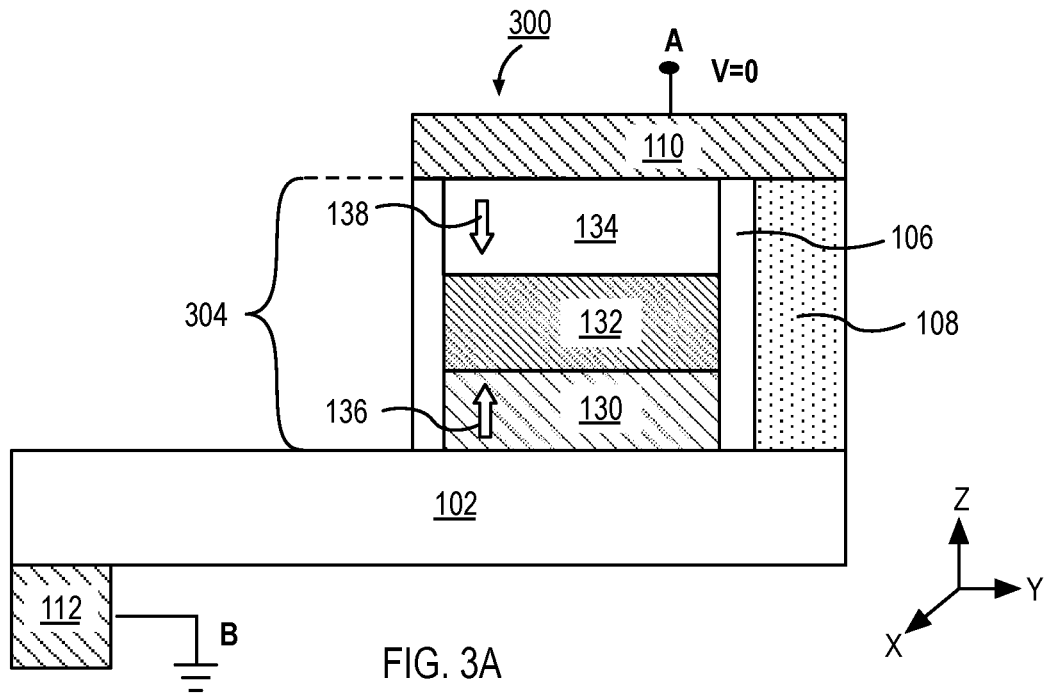
FIG. 3A illustrates a memory device in a high resistance state.

FIG. 3A illustrates a spin orbit memory device in a high resistance state. In an embodiment, the spin orbit memory device 300 includes an MTJ 304, a dielectric spacer 106 adjacent to the MTJ 304 and a selector element 108 adjacent to dielectric spacer 106. The selector element 108 is electrically coupled with the top electrode 110 and spin orbit electrode 102. For illustration purposes the MTJ 304 includes a free magnet 130 in contact with the spin orbit electrode 102, a tunnel barrier 132 on the free magnet 130 and a fixed magnet 134 on the tunnel barrier 132. In an embodiment, the free magnet 130 has a magnetization 136 in the positive z-direction and the fixed magnet 134 of the MTJ 304 has a magnetization 138 in the negative z-direction (anti-parallel to magnetization 136). In an embodiment, when the free magnet 130 has a magnetization 136 that is anti-parallel to a magnetization 138 in the fixed magnet 134, the MTJ 304 is said to be in a high resistance state.

In an embodiment, a voltage bias between the conductive interconnect 110 (terminal A) and the conductive electrode 112 (terminal B) is 0 V. In one embodiment, the selector element 108 is in a non-conductive state, when the voltage bias between the conductive interconnect 110 (terminal A) and the conductive interconnect 112 (terminal B) is 0 V, as shown in FIG. 3A.

Figure 3B:
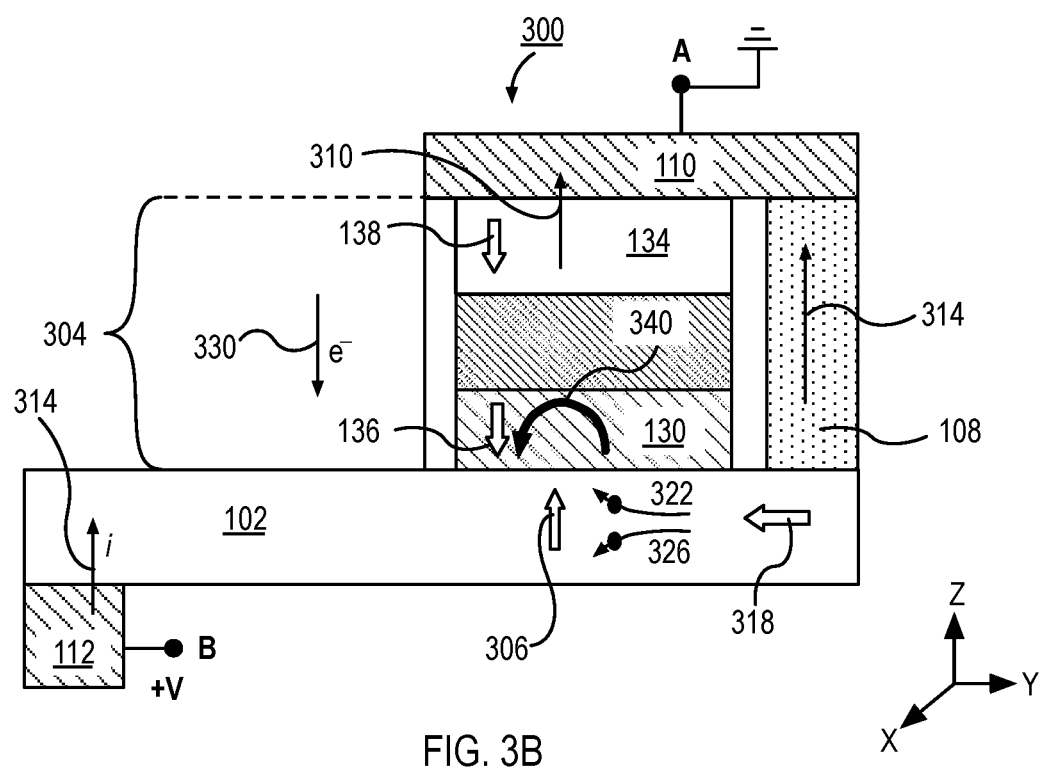
FIG. 3B illustrates a memory device switched to a low resistance state after the application of a spin hall current and a spin torque transfer current.

FIG. 3B illustrates a spin orbit memory device 300 switched to a low resistance state after the application of a spin hall current and a spin torque transfer current. In an embodiment, a reversal in the magnetization 136 of the free magnet 130 in FIG. 3B compared to the magnetization 136 of the free magnet 130 in FIG. 3A is brought about by (a) inducing a spin diffusion current 306 in the spin orbit electrode 102 in the positive z-direction, and (b) by applying an $i_{STTM}$ current 310. In an embodiment, the spin diffusion current 306 flows through the spin orbit electrode 102 when there is current conduction through the selector element 108. The direction of the spin diffusion current (positive or negative z-direction) depends on whether the spin orbit electrode 102 has a positive spin Hall angle or a negative spin Hall angle.

In an embodiment, a positive voltage bias is applied to the conductive interconnect 112 and the conductive interconnect structure 110 is at ground potential. In an embodiment, when the applied bias voltage exceeds a threshold voltage, $V_T$, the selector element 108 turns on. Current 314 begins to flow through the selector element 108. An electron current 318 flows in the negative y-direction. The electron current 318 includes electrons with two opposing spin orientations, a type I electron 322, having a spin oriented in the positive x-direction and a type II electron 326 having a spin oriented in the negative x-direction. In an embodiment, electrons constituting the electron current 318 experience a spin dependent scattering phenomenon in the spin orbit electrode 102. The spin dependent scattering phenomenon is brought about by a spin-orbit interaction between the nucleus of the atoms in the spin orbit electrode 102 and the electrons in the electron current 318. In an embodiment, the spin dependent scattering phenomenon causes type I electrons 322, whose spins are oriented in the positive x-direction, to be deflected upwards towards an uppermost portion of the spin orbit electrode 102 and type II electrons 326 whose spins are oriented in the negative x-direction to be deflected downwards towards a lowermost portion of the spin orbit electrode 102. The separation between the type I electrons 322 and the type II electrons 326 induces a spin diffusion current 306 in the spin orbit electrode 102. In an embodiment, the spin diffusion current 306 is directed upwards toward the free magnet 130 of the MTJ 304 as depicted in FIG. 3B. The polarized spin diffusion current 306 induces a spin hall torque on the magnetization 136 of the free magnet 130. The spin hall torque rotates the magnetization 136 to a temporary state pointing in the negative x-direction. In an embodiment, to complete the magnetization reversal process an additional torque is applied.

In an embodiment, by application of a voltage $V>V_T$, at terminal B, an $i_{STTM}$ current 310 flows through the MTJ 304 and spin polarized electron current 330 flows through the tunnel barrier 132 and into the free magnet 130. In an embodiment, the spin polarized electron current 330 exerts an additional torque on the magnetization 136 of the free magnet 130. The additional torque exerted by the spin polarized electron current 330 causes the magnetization to rotate (shown by arrow 340) to the negative z-direction. The combination of spin torque (from spin diffusion current) and spin transfer torque (from STTM current) causes flipping of magnetization 136 in the free magnet 130 from the positive z-direction illustrated in FIG. 3A to a negative z-direction illustrated in FIG. 3B.

Figure 3C:
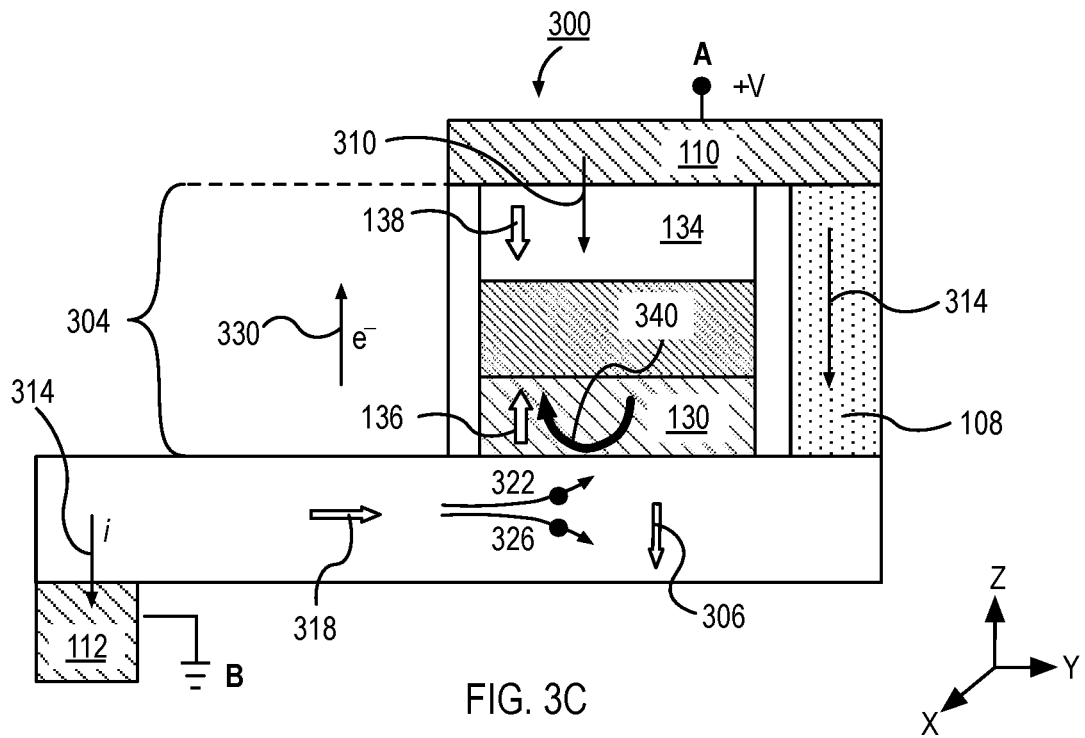
FIG. 3C illustrates a memory device switched to a high resistance state after the application of a spin hall current and a spin torque transfer current.

FIG. 3C illustrates a spin orbit memory device 300 switched to a high resistance state after the application of a spin hall current and a spin torque transfer current. In an embodiment, a reversal in the direction of magnetization 136 of the free magnet 130 in FIG. 3C compared to the direction of magnetization 136 of the free magnet 130 in FIG. 3B is brought about by (a) reversing the direction of the spin diffusion current 306 in the spin orbit electrode 102 and (b) by reversing the direction of the $i_{STTM}$ current 310.

In an embodiment, by applying a positive bias above $V_T$ on terminal A and connecting terminal B to ground potential, current 314 flows through the selector element 108 in the direction illustrated in FIG. 3C. The electron current 318 now flows in the positive y-direction and creates a spin diffusion current 306. The spin diffusion current 306 induces torque on the free magnet 314 in a manner described above. In an embodiment, the spin torque causes the magnetization 136 in the free magnet 130 to temporarily orient in the positive x-direction. In an embodiment, the spin polarized electron current 330 exerts an additional torque on the magnetization 136 of the free magnet 130. The additional torque exerted by the spin polarized electron current 330 (corresponding to STTM current 310) causes the magnetization to rotate towards the positive z-direction. The combination of spin torque (from spin diffusion current) and spin transfer torque (from STTM current) causes flipping of magnetization 136 in the free magnet 130 from the negative z-direction illustrated in FIG. 3B back to a positive z-direction illustrated in FIG. 3C (indicated by the rotation arrow 340).

Figure 3D:
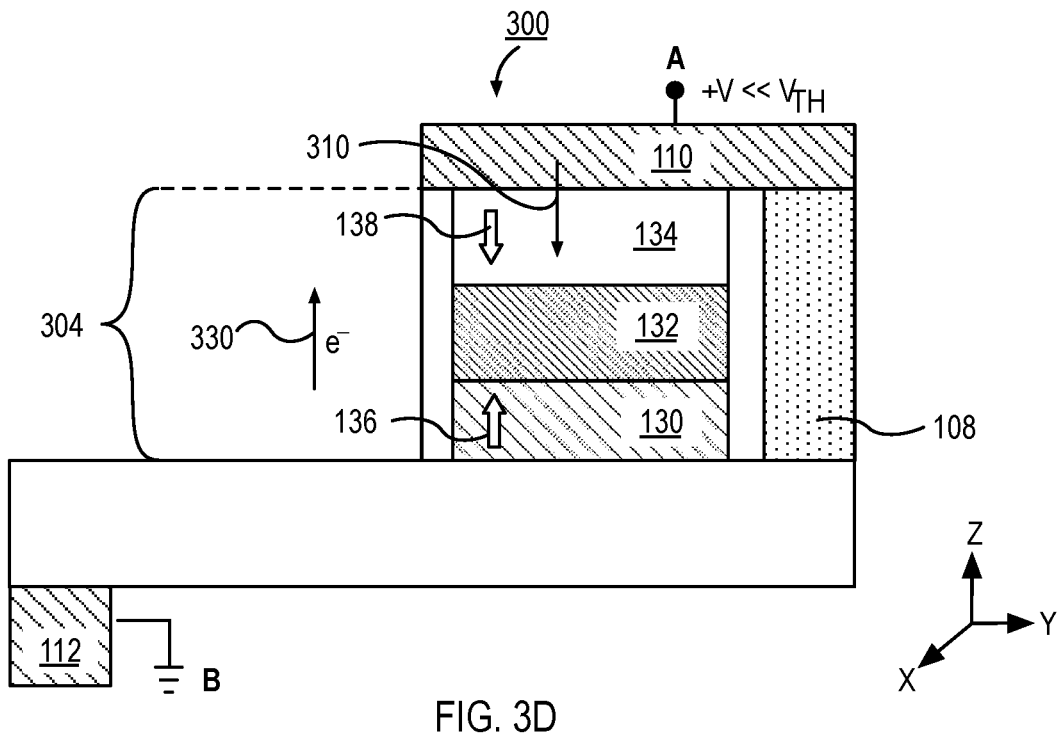
FIG. 3D illustrates a read operation performed on a memory device.

FIG. 3D illustrates a read operation performed on a spin orbit memory device. In an embodiment, when the applied voltage on terminal A is less than $V_T$, the selector element 108 is in a non-conductive state. In an embodiment, the magnitude of the applied voltage for a read operation is approximately 0.1-0.2V. In an embodiment, when the MTJ 304 is in a high resistance state, the current 310 through the MTJ 304 is lower compared to the current flowing through the MTJ 304 during an on-state of the device. In an embodiment, when the MTJ 304 is in a low resistance state, current 310 will flow through the MTJ 304. In an embodiment, the current 310 is inversely proportionate to the resistance of the MTJ 304.

Figure 4:
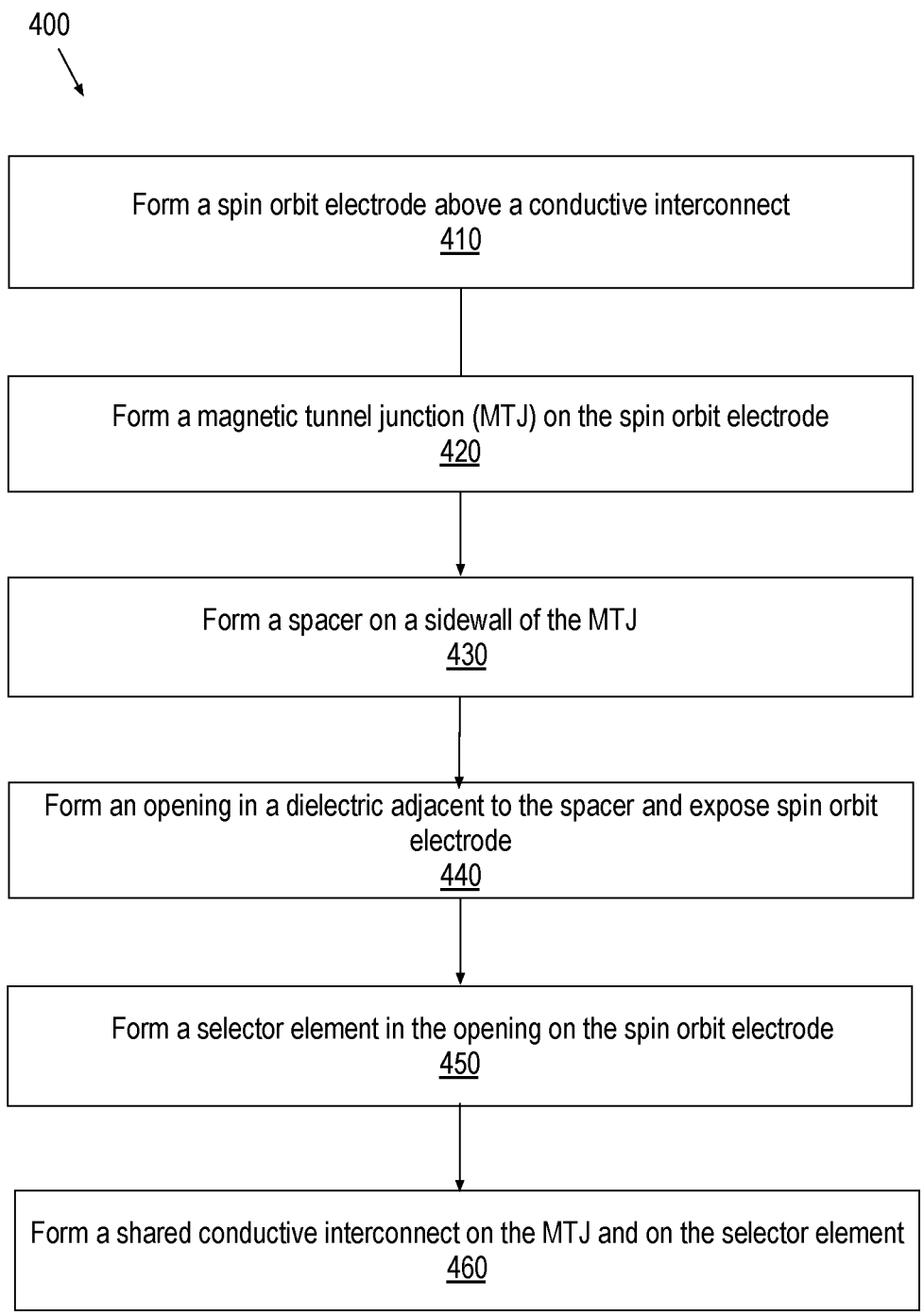
FIG. 4 illustrates a flow diagram for a method to fabricate a two terminal memory device, in accordance with embodiments of the present disclosure.

FIG. 4 illustrates a flow diagram of a method to fabricate a spin orbit memory device such as a spin orbit memory device 100A. The method 400 begins at operation 410 by forming a spin orbit electrode in a dielectric layer on a conductive interconnect. The method 400 continues at operation 420 with the formation of an MTJ device on the spin orbit electrode. In exemplary embodiments, the spin orbit material and all layers in the material layer stack are blanket deposited in-situ without breaking vacuum and patterned. In a simplest embodiment, forming the material layer stack includes a deposition of a free magnetic layer on the spin orbit material, deposition of a tunnel barrier layer over the free magnetic layer, deposition of a fixed magnetic layer over the tunnel barrier layer. In an embodiment, the formation of the material layer stack further includes deposition of a plurality of layers of a synthetic antiferromagnetic (SAF) layer over the fixed magnetic layer, and deposition of a conductive material on the SAF layer. The method 400 continues at operation 430 with the formation of a spacer adjacent to the MTJ device. The method 400 continues at operation 440 by formation of an opening in a dielectric adjacent to the spacer. In an embodiment, the opening exposes a portion of spin orbit electrode 102 directly adjacent to the spacer 106. The method continues at operation 450 by depositing a selector material in the opening on the spin orbit electrode and planarizing excess selector material outside the opening to form a selector element. The method concludes at operation 460 by forming a shared conductive interconnect on the MTJ and on the selector element.

FIGS. 5A-8 illustrate cross-sectional views of the spin orbit memory device 100A illustrated in FIG. 1A evolving as a fabrication method, such as method 400, is practiced.

Figure 5A:
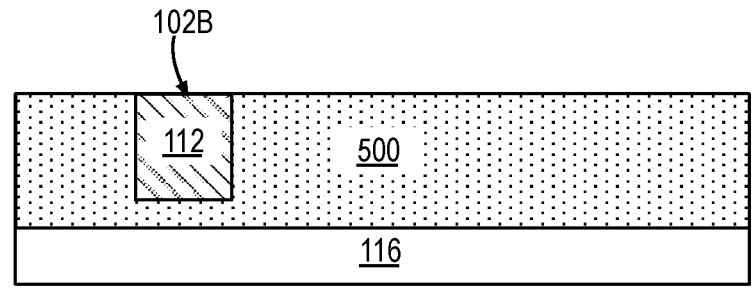
FIG. 5A illustrates a cross-sectional view following the formation of a conductive interconnect in a first dielectric above a substrate, in accordance with an embodiment of the present disclosure.

FIG. 5A illustrates the structures of conductive interconnect 112 surrounded by a dielectric 500 formed above a substrate 116. In an embodiment, the conductive interconnect 112 are formed in a dielectric 500 by a damascene or a dual damascene process. In an embodiment, each of the conductive interconnect 112 include a barrier layer, such as titanium nitride, ruthenium, tantalum, tantalum nitride, and a fill metal, such as copper, tungsten. In an embodiment, the conductive interconnect 112 fabricated using a subtractive etch process when materials other than copper are utilized. In one such embodiment, the conductive interconnect 112 includes a material such as but not limited to titanium nitride, ruthenium, tantalum, tantalum nitride. In some examples, the dielectric 500 includes a material such as but not limited to silicon dioxide, silicon nitride, silicon carbide, or carbon doped silicon oxide. In an embodiment, the dielectric 500 has an uppermost surface 500A that is substantially co-planar the uppermost surface 112B of the conductive interconnect 112. The dielectric 500 may include a material that is the same or substantially the same as the dielectric material 102 described above. Depending on embodiments, the dielectric 500 has a total thickness between 70 nm-120 nm. In some examples, the conductive interconnect 112 is electrically connected to a circuit element such as an access transistor (not shown). Logic devices such as access transistors may be integrated with memory devices such as a spin orbit device to form embedded memory.

Figure 5B:
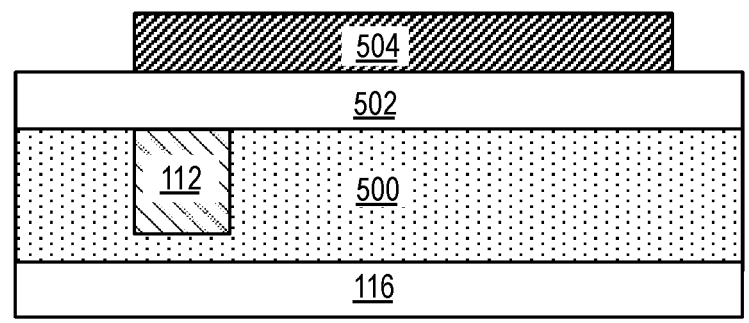
FIG. 5B illustrates a cross-sectional view of the structure in FIG. 5A following the deposition of an electrode layer including a spin orbit material on the conductive interconnect, and following the formation of a mask on the electrode layer in accordance with embodiments of the present disclosure.

FIG. 5B illustrates a cross-sectional view of the structure in FIG. 5A following the formation of a layer 502 including a spin orbit material (herein spin orbit layer 502) on the conductive interconnect 112 and on the dielectric 500 and following the formation of a mask 504 on the spin orbit layer 502.

In an embodiment, the layer 502 is blanket deposited using a physical vapor deposition (PVD) or a chemical vapor deposition (CVD) process. In an embodiment, spin orbit layer 502 includes a spin orbit material such as tantalum, tungsten, platinum or gadolinium, β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In an embodiment, spin orbit layer 502 including tungsten, tantalum or copper can be doped with Co, Fe, Ni, MnGa, MnGeGa, Bct-Ru, Gd or Tb. In some embodiments, the spin orbit layer 502 is deposited to a thickness that is between 5 nm and 20 nm. The as deposited thickness of the spin orbit layer 502 may be greater than the final thickness of a spin orbit electrode to be formed as a fraction of the upper portion of the layer 502 may be removed during the fabrication process.

A mask 504 may be formed on the layer 502. In some embodiments, the mask 504 is formed by a lithographic process. In other embodiments, the mask 504 includes depositing and patterning a dielectric material on the layer 502. The mask 504 defines a shape, size and location of a spin orbit electrode to be subsequently formed relative to the conductive interconnect 112. In some embodiments, the mask 504 has a rectangular plan view shape as is depicted in the plan view illustration of FIG. 1B.

Figure 5C:
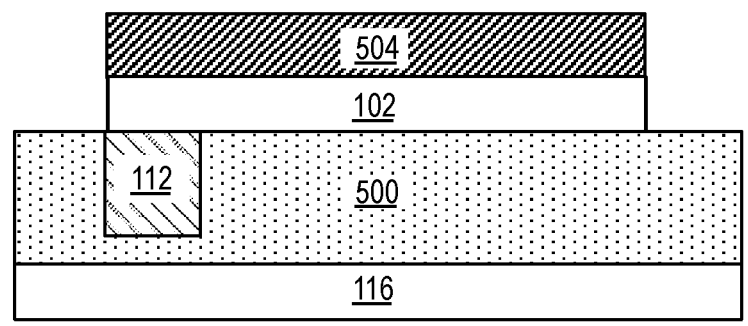
FIG. 5C illustrates a cross-sectional view of the structure in FIG. 5B following the patterning of an electrode layer including a spin orbit material formed on the conductive interconnect, in accordance with embodiments of the present disclosure.

FIG. 5C illustrates a cross-sectional view of the structure in FIG. 5B following the process of patterning the spin orbit layer 502 to form spin orbit electrode 102. In an embodiment, a plasma etch process is utilized to pattern the spin orbit layer 502. In an embodiment, the patterning process recesses portions of the dielectric 500 adjacent to the spin orbit electrode 102.

Figure 5D:
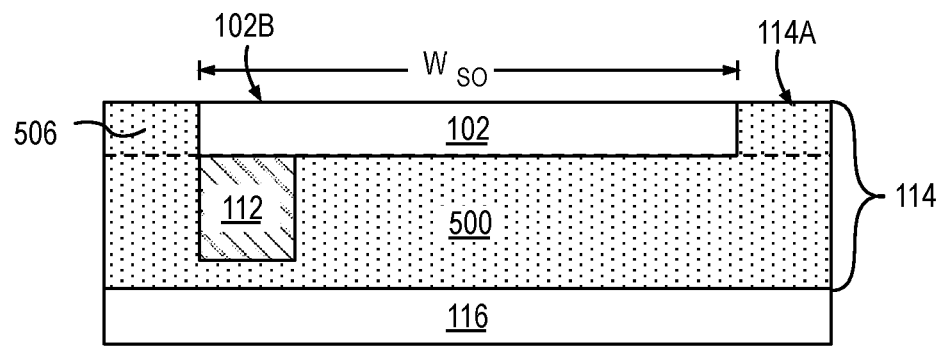
FIG. 5D illustrates a cross-sectional view of the structure in FIG. 5C following the deposition of a second dielectric on the patterned electrode layer and planarization of the dielectric and uppermost portion of the patterned electrode layer to form a spin orbit electrode.

FIG. 5D illustrates a cross-sectional view of the structure in FIG. 5C following the deposition of a second dielectric 506 on the spin orbit electrode 102 and planarization of the second dielectric material 506. In an embodiment, the dielectric 506 is blanket deposited on the spin orbit electrode 102 and on the dielectric 500 after mask 504 is removed. In some examples, the dielectric 506 may include a material that is substantially the same as the material of the dielectric 500. Dielectric 506 may be deposited using a plasma enhanced chemical vapor deposition (PECVD), physical vapor deposition (PVD), chemical vapor deposition (CVD) or an atomic layer deposition (ALD) process. A planarization process is carried out to remove excess dielectric 506 from above the spin orbit electrode 102.

The portions of the of dielectric layer 506 remaining adjacent to the spin orbit electrode 102 after the planarization process and the dielectric layer 504 is collectively referred to as dielectric 114 housing the spin orbit electrode 102. In an embodiment, the planarization process further removes an upper portion of the spin orbit electrode 102. In an embodiment, the spin orbit electrode 102 and the dielectric 114 surrounding the spin orbit electrode 102 have uppermost surfaces 102B and 114A, respectively, that are substantially co-planar following the planarization process. In an embodiment, the planarization process is a chemical mechanical polish process. In an example, the planarization process forms a spin orbit electrode 102 having a topographically smooth uppermost surface with a surface roughness that is less than 1 nm. In an embodiment, the spin orbit electrode 102 has a resultant thickness between 2m and 15 nm after the planarization process.

When the mask 504 includes a dielectric material, the mask 504 may not be removed prior to deposition of dielectric material 506. The dielectric 506 may be deposited on the mask 504. The excess dielectric 506 on the mask 504 and the mask 504 may be removed during the planarization process.

Figure 5E:
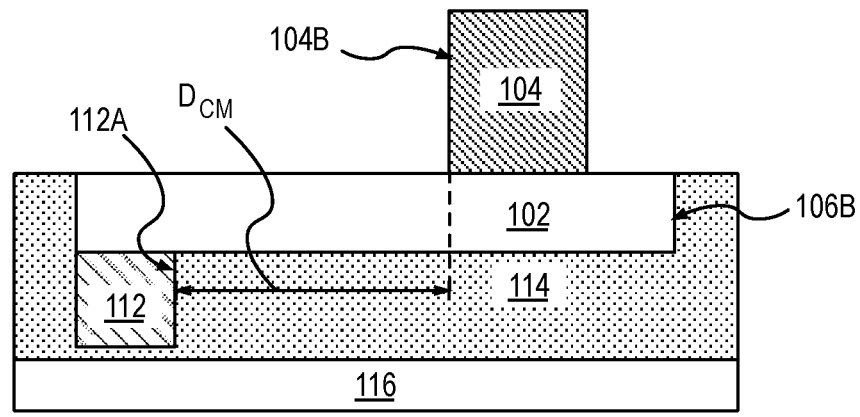
FIG. 5E illustrates a cross-sectional view of the structure in FIG. 5D following the formation of a magnetic junction on a portion of the electrode.

FIG. 5E illustrates a cross-sectional view of the structure in FIG. 5D following the formation of a magnetic tunnel junction (MTJ) 104 on a portion of the spin orbit electrode 102. In an embodiment, forming the magnetic tunnel junction 104 includes sequentially depositing various layers described in association with FIG. 2A to form an MTJ material layer stack. Referring again to FIG. 5E, the individual layers in MTJ material layer stack may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In an embodiment, a mask is formed on the MTJ material layer stack and the MTJ material layer stack is patterned to form MTJ 104.

In an embodiment, after all the layers in the MTJ material layer stack are deposited, an anneal is performed. In an embodiment, the anneal is performed immediately post deposition but before patterning of the material layer stack. A post-deposition anneal of the material layer stack is carried out in a furnace in a forming gas environment. In an embodiment, the anneal temperature ranges between 300 and 450 degrees Celsius.

As shown, MTJ 104 is formed so that sidewall 104B of the MTJ 104 is separated from the sidewall 112A of the conductive interconnect 112 by a distance, $D_{CM}$. In an embodiment, $D_{CM}$ is at least 3 nm. In the illustrative embodiment, $D_{CM}$ is at least 20 nm.

Figure 5F:
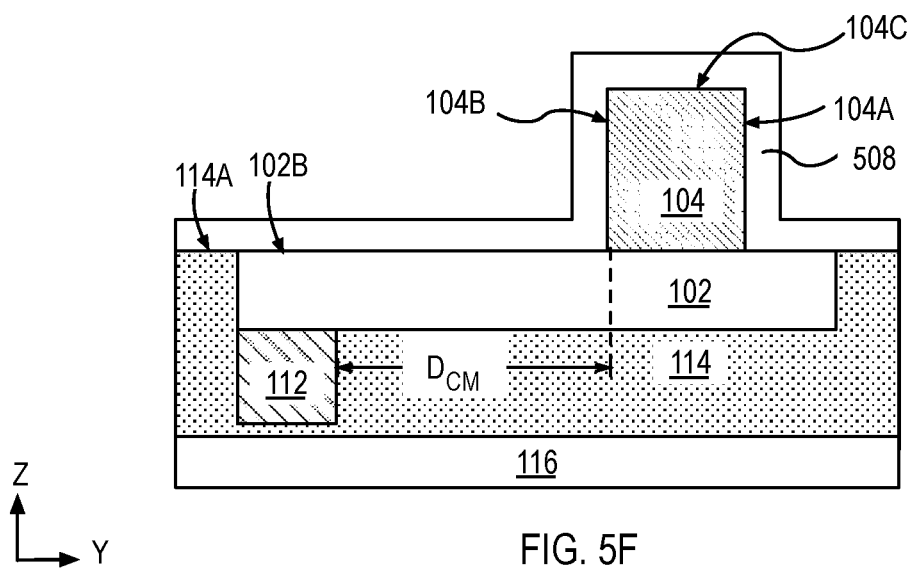
FIG. 5F illustrates a cross-sectional view of the structure in FIG. 5E following the formation of a dielectric spacer layer on the magnetic junction, on a portion of the electrode and on the second dielectric.

FIG. 5F illustrates a cross-sectional view of the structure in FIG. 5E following the formation of a dielectric spacer layer 508 on the magnetic junction 104, on a portion of the spin orbit electrode 102 and on the dielectric 114. In the illustrative embodiment, the dielectric spacer layer 508 is blanket deposited on an uppermost surface 104C and on sidewalls 104A and 104B of MTJ 104, on uppermost surface 102B of the spin orbit electrode 102 and on uppermost surface 114A of the dielectric 114. The deposition process utilized may include a PECVD, PVD, CVD or an ALD process. In an embodiment, the dielectric material includes silicon and nitrogen and/or carbon. In an embodiment, the dielectric spacer layer 508 is deposited to a thickness between 2 nm and 50 nm.

Figure 6A:
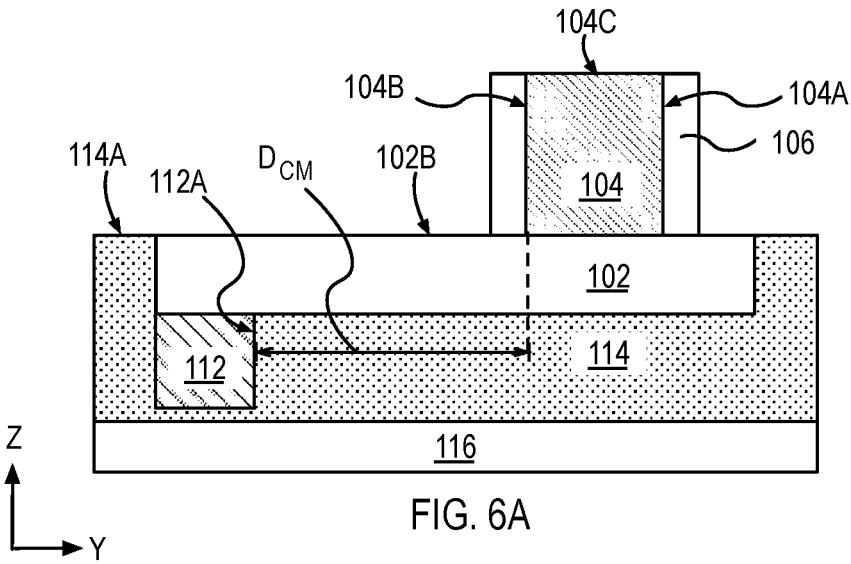
FIG. 6A illustrates a cross-sectional view of the structure in FIG. 5E following the formation of a dielectric spacer adjacent to the magnetic tunnel junction.

FIG. 6A illustrates a cross-sectional view of the structure in FIG. 5F following the formation of a dielectric spacer 106 adjacent to the magnetic tunnel junction 104. In an embodiment, plasma etch process is utilized to pattern the dielectric spacer layer 508. The plasma etch process removes portions of the dielectric spacer layer 508 from surface 104C and from uppermost surface 114A. The dielectric spacer 106 is formed on a portion of the uppermost surface 102B adjacent to sidewalls 104A and 104B of MTJ 104. In some embodiments, the dielectric spacer layer 508 includes a material that is similar to the dielectric 114. In some such embodiments, portions of dielectric 114 adjacent to the spin orbit electrode 102 may be recessed during etching of the dielectric spacer layer 508 (as depicted in FIGS. 1F and 1G).

Figure 6B:
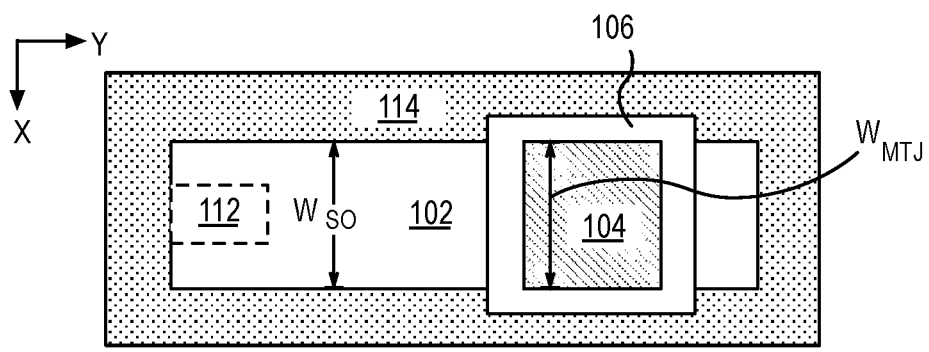
FIG. 6B illustrates a plan view of the structure in FIG. 6A, depicting a relative shape and size of the magnetic junction relative to the spin orbit electrode and a shape of dielectric spacer, in accordance with an embodiment of the present disclosure.

FIG. 6B illustrates a plan view of the structure in FIG. 6A, depicting a relative shape and size of the magnetic junction relative to the spin orbit electrode 102 and a plan view of the layout of the dielectric spacer 106, in accordance with an embodiment of the present disclosure.

As, shown, the dielectric spacer 106 is formed peripherally around the MTJ 104. In the illustrative embodiment, the MTJ 104 has a width $W_{MTJ}$, that is the same or substantially the same as the width, $W_{SO}$. In other embodiments, $W_{MTJ}$ is less than $W_{SO}$. When $W_{MTJ}$ is substantially similar to $W_{SO}$ portions of the dielectric spacer 106 may be also formed on the dielectric 114.

Figure 7A:
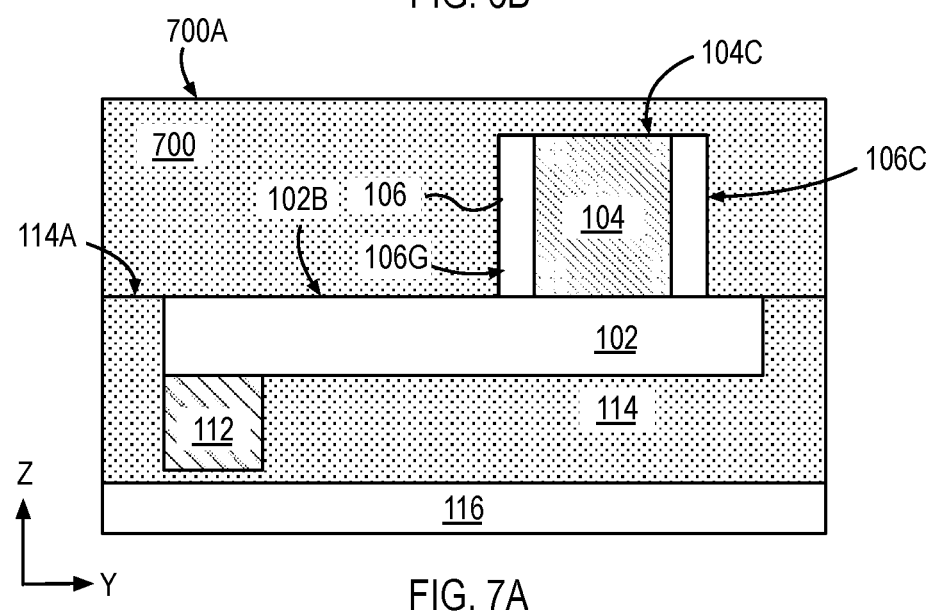
FIG. 7A illustrates the structure of FIG. 6A following the deposition of a third dielectric on a top surface of the magnetic junction, on sidewall of the dielectric spacer, on the spin orbit electrode and on the second dielectric.

FIG. 7A illustrates the structure of FIG. 6A following the deposition of a dielectric 700. In an embodiment, dielectric 700 is blanket deposited on an uppermost surface 104C of the magnetic junction 104, on sidewalls 106C and 106G of the dielectric spacer 106, on the uppermost surface 102B of spin orbit electrode 102 and on uppermost surface 114A of dielectric 114. In an embodiment, after deposition the dielectric material 700 is planarized. Planarization may include a chemical mechanical polish (CMP) process that forms a substantially planar uppermost surface 700A of the dielectric material 700. In the illustrative embodiment, the polish process does not expose the uppermost surface 104C of the MTJ 104.

Figure 7B:
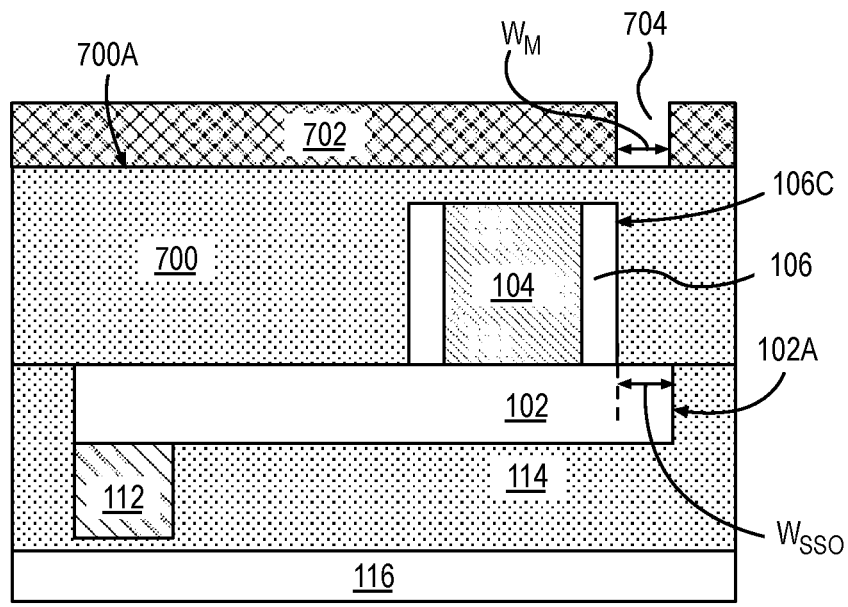
FIG. 7B illustrates a plan view of the structure in FIG. 7A, following the formation of a mask to define a location for a selector element, on the third dielectric.

FIG. 7B illustrates the structure of FIG. 7A following the formation of a mask 702 on uppermost surface 700A. In some embodiments, the mask 702 is formed by a lithographic process. The mask 702 includes an opening 704. Opening 704 will determine where material for a selector element will be deposited. In the illustrative embodiment, the opening 704 has a lateral width, $W_M$, (along the Y direction) that is substantially the same as a lateral spacing, $W_{SSO}$ between spacer sidewall 106C and spin orbit electrode sidewall 102A. In one embodiment, $W_M$ is greater than $W_{SSO}$. In another embodiment, $W_M$ is smaller than $W_{SSO}$.

In an embodiment, a sidewall 702A of mask 702 is aligned to the spacer sidewall 106C. Alignment between sidewall 702A and spacer sidewall 106C may prevent spacer from being etched in a downstream process.

Figure 8A:
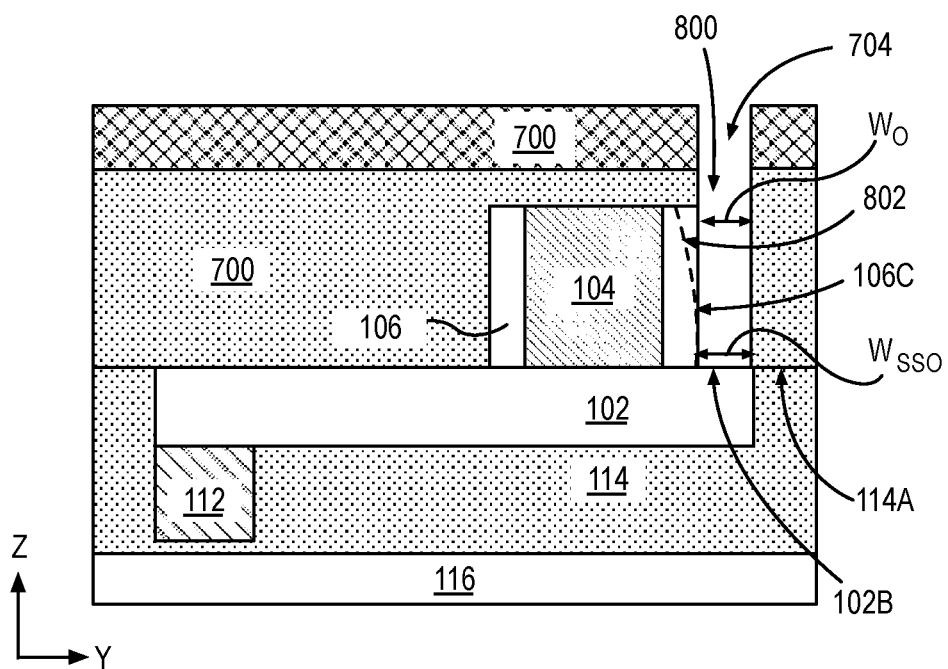
FIG. 8A illustrates the structure of FIG. 7B, following the formation of a selector opening in the third dielectric material to define a location for the formation of a selector material.

FIG. 8A is a cross-sectional illustration of the structure of FIG. 7B following the formation of an opening 800 in the dielectric material 700. In an embodiment, the opening 800 is formed by etching the dielectric material 700 through the opening 704 in the mask 702 using a plasma etch process. In the illustrative embodiment, the opening 704 exposes sidewall 106C of the spacer 106 and a portion of the uppermost surface 102B of the spin orbit electrode 102. In the illustrative embodiment, the opening 800 has a width, $W_M$ that is not sufficiently wide enough to expose the uppermost surface 114A of the dielectric 114. In other examples, when opening 704 has a width, $W_M$ that is greater than $W_{SSO}$ the plasma etch process can expose portions of surface 114A after the dielectric 700 is etched.

In some embodiments, when sidewall 702A of mask 702 is not perfectly aligned to the spacer sidewall 106C, the plasma etch process may erode portions of sidewall 106C. In some such embodiments, an eroded sidewall 106C may have a profile depicted by dashed line 802.

Figure 8B:
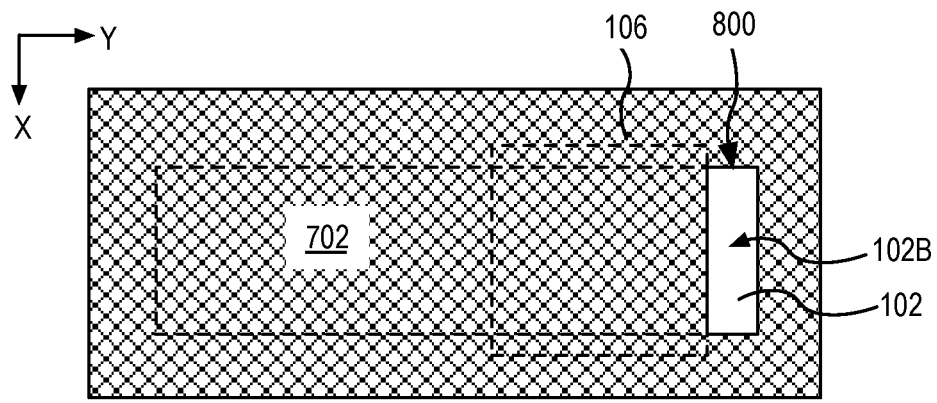
FIG. 8B illustrates a plan view of the structure in FIG. 8A.

FIG. 8B illustrates a plan-view illustration of the structure in FIG. 8A. An outline of the spin orbit electrode 102 is shown in FIG. 8B to illustrate the location of opening 800 relative to the spin orbit electrode 102. In an embodiment, the opening 800 has a rectangular shape, where the opening 800 exposes only the uppermost surface 102B of the spin orbit electrode 102 and not the dielectric 114 (not shown in Figure). In other embodiments, the opening may be wide enough to expose the dielectric 114 (not shown in Figure). In some embodiments, the opening 800 can extend peripherally around the spacer 106.

Figure 9:
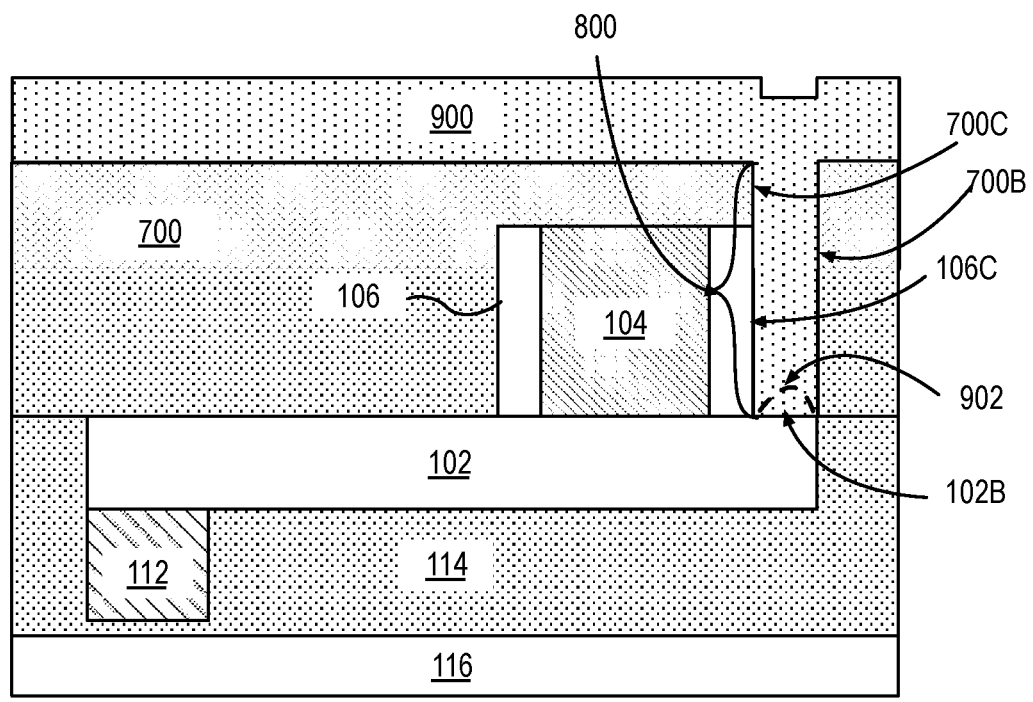
FIG. 9 illustrates the structure of FIG. 8A following the deposition of a selector material in the selector opening and on the spin orbit electrode.

FIG. 9 is a cross-sectional illustration of the structure of FIG. 8A following the deposition of a selector element material 900. In an embodiment, the selector element material 900 is blanket deposited into the opening 800 after removal of the mask 800. In the illustrative embodiment, the selector material 900 is deposited on the uppermost surface 102B of spin orbit electrode 102, on spacer sidewall 106C and on dielectric material sidewall 900B. The selector element material 900 is also deposited on sidewalls 700B and 700C of the dielectric material 700. In an embodiment, the selector element material is deposited using a reactive sputtering, magnetron sputtering or an atomic layer deposition process. In an embodiment, the selector element material 900 includes a material that is the same or substantially the same as the material of the selector element 108.

In an embodiment, the selector element material 900 is amorphous as deposited and has a columnar grain boundary. In another embodiment, the selector element material 900 is crystalline as deposited. In an embodiment, selector element material 900 is crystalline after an electroforming process (application of a high voltage pulse). In an embodiment, the selector element material 900 is in a monoclinic phase (insulating) or in a rutile phase (metallic) after an electroforming process.

In some embodiments, a metallic structure 902 (indicated by dashed lines) can be formed on surface 102B of the spin orbit electrode 102. The metallic structure 902 can be selectively formed on the spin orbit electrode 102 to provide a work function electrode. In an embodiment, the metallic structure 902 does not have a defined shape but fills a lateral portion of the opening between sidewalls 106C and 700B.

Figure 10A:
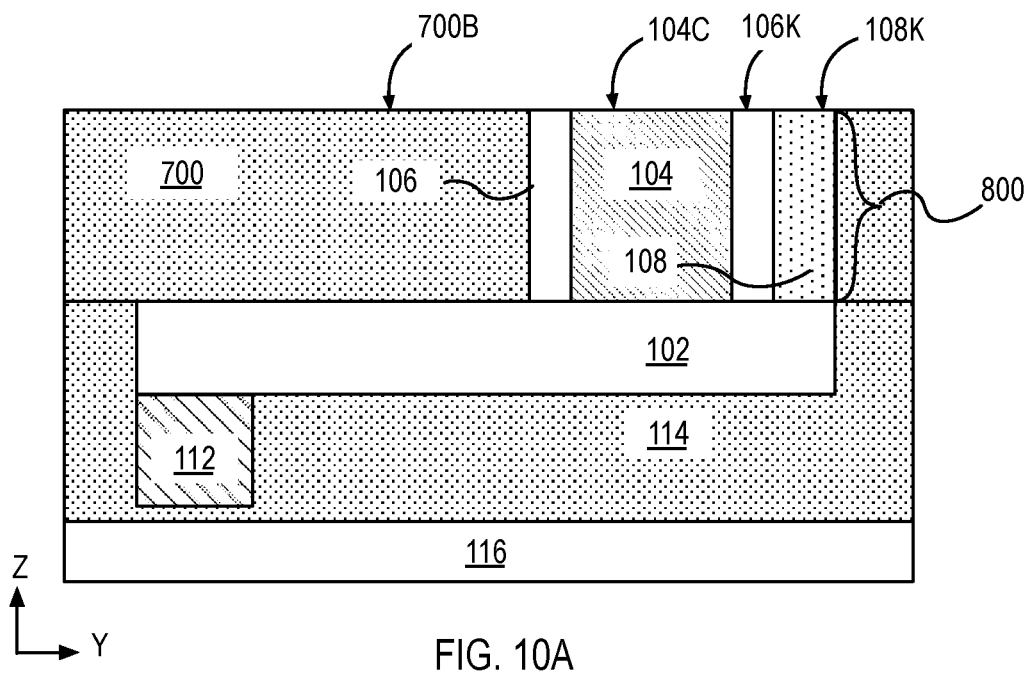
FIG. 10A illustrates the structure of FIG. 8 following the planarization of the selector material from top surfaces of the dielectric spacer, from above the magnetic junction and the third dielectric.

FIG. 10A illustrates the structure of FIG. 9 following the planarization of the selector element material 900 from uppermost surface of the dielectric material 700. The planarization process, may for example, include a chemical mechanical polish (CMP) process. The CMP process removes the selector element material 900 from above the uppermost surface 700A. The CMP process may be continued until a portion of the dielectric material 700 above the MTJ 104 is removed, as shown. The CMP process isolates and forms a selector element 108 in the opening 800 on the spin orbit electrode 102. After the CMP process, uppermost surface 104C, an uppermost surface 700B of the dielectric material 700, uppermost surface 106K of the spacer 106 and uppermost surface 108K of the selector element 108 are co-planar or substantially co-planar.

Figure 10B:
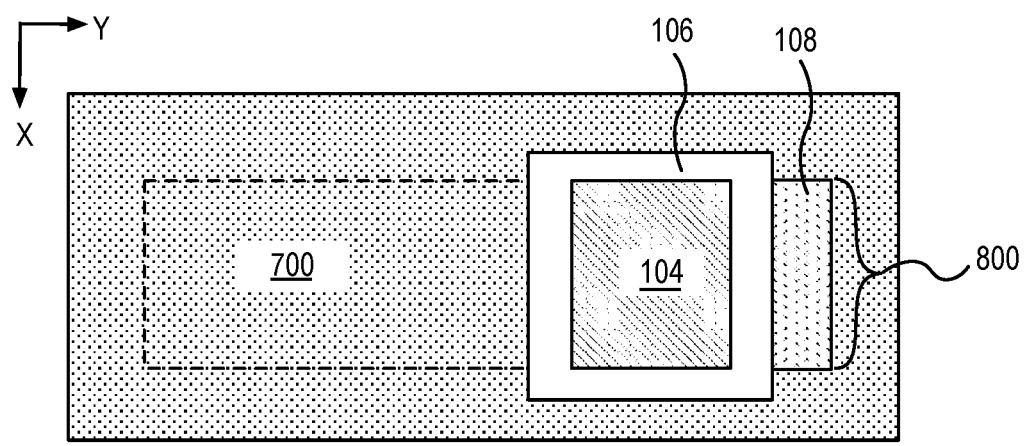
FIG. 10B illustrates a plan view illustration of the structure of FIG. 10A.

FIG. 10B illustrates a plan view illustration of the structure in FIG. 10. The selector element 108 is confined to the opening 800 and isolated from the MTJ 104 by spacer 106.

Figure 11A:
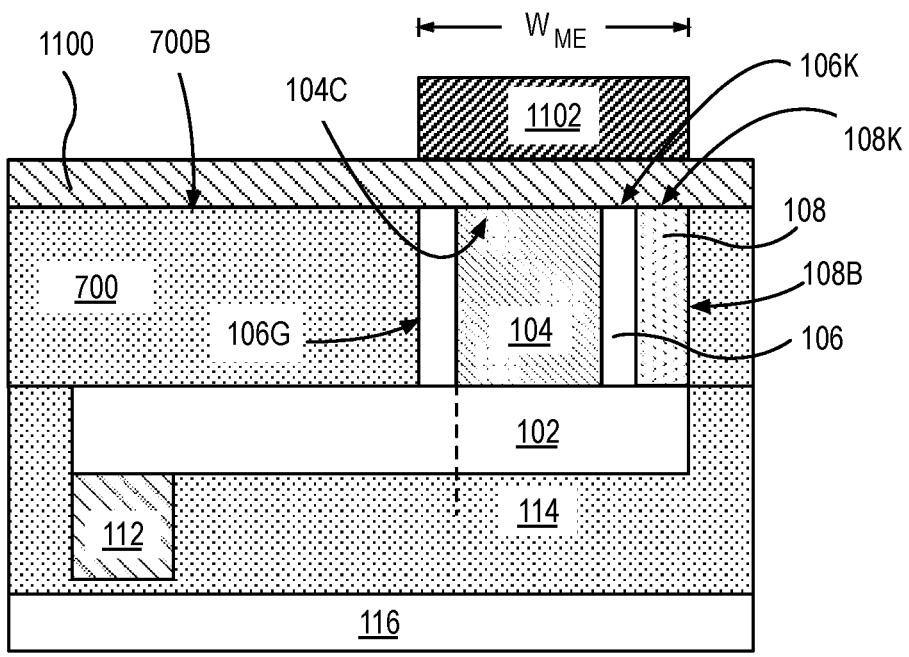
FIG. 11A illustrates the structure of FIG. 10A following the formation of a metallization electrode layer on top surfaces of the magnetic junction, the dielectric spacer, the selector element and the third dielectric and following the formation of a mask on the metallization electrode layer.

FIG. 11A illustrates the structure of FIG. 10A following the formation of a metallization layer 1100 on uppermost surfaces 104C, 700B, 106K and 108K and following the formation of a mask 1102 on the metallization layer 1100. In an embodiment, the metallization electrode layer 1100 includes a material that is the same or substantially the same as the material of the conductive interconnect 110. A mask 1102 is formed on the metallization layer 1100. In some embodiments, the mask 1102 is formed by a lithographic process. In other embodiments, the mask 1102 includes depositing and patterning a dielectric material on the metallization layer 1100. The mask 1102 defines a shape and size of a conductive interconnect that will be formed. The mask has a lateral width $W_{ME}$ that extends over the selector element 108 and over MTJ 104 and the dielectric spacer 106. In some embodiments, the mask 1102 extends laterally beyond sidewalls 106G and 108B.

Figure 11B:
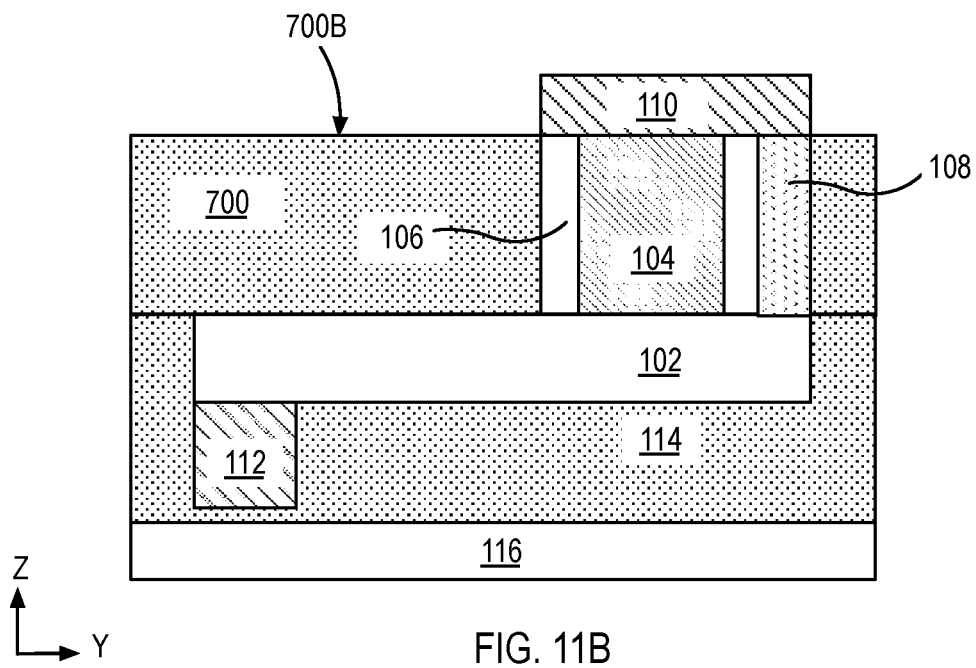
FIG. 11B illustrates the structure of FIG. 11A following the formation of a shared metallization electrode on the magnetic junction and on the selector element.

FIG. 11B illustrates the structure of FIG. 11A following the formation of conductive interconnect 110 on the magnetic junction 104 and on the selector element 108. In an embodiment, a plasma etch process is utilized to pattern the metallization layer 1100. After the patterning process, the mask 1102 is removed. The etch process exposes uppermost surface 700B as shown.

In some embodiments, portions of the dielectric 700 adjacent to spacer 106 and selector element 108 may be etched preferentially while patterning the conductive interconnect 110.

The structure in FIG. 11B represents an embodiment of the memory device 100. Variations in one or more process operations may be implemented from those described above to fabricate the variety of devices 100B, 100C, 100D etc.

Figure 12A:
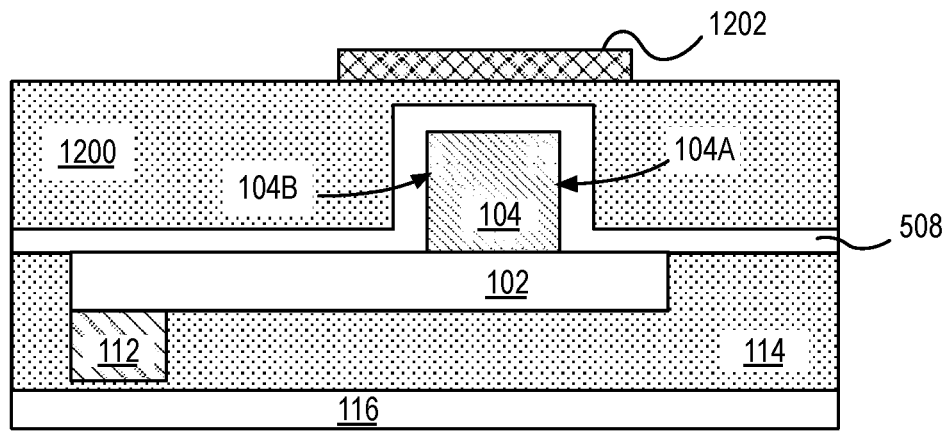
FIG. 12A illustrates the structure of FIG. 5F following the formation of a fourth dielectric on the dielectric spacer and following the formation of a mask on the fourth dielectric.

FIG. 12A is a cross-sectional illustration of the structure in FIG. 5F after the formation of a dielectric 1200. In an embodiment, dielectric 1200 is blanket deposited on the dielectric spacer layer 508. In an embodiment, the dielectric 1200 includes a material that is different from the dielectric 114 and dielectric spacer layer 508. The dielectric 1200 may include a spin on glass material that is removable by a wet chemical etch process selectively to the dielectric 114. In an embodiment, the spin on glass material includes silicon, oxygen and polymers. The dielectric 1200 may be deposited by a PECVD, CVD or a PVD process. In an embodiment, after deposition the dielectric 1200 is planarized. Planarization may include a CMP process that forms a substantially planar uppermost surface 1200A of the dielectric 1200. In the illustrative embodiment, the polish process does not expose the dielectric spacer layer 508. In the illustrative embodiment, a portion of dielectric 1200 remains on the dielectric spacer layer 508 above the MTJ 104.

After planarization a mask 1202 is formed on the dielectric 1200. The mask 1202 extends beyond dielectric spacer layer 508 formed on MTJ sidewalls 104A and 104B. In some embodiments, the mask 1202 is formed by a lithographic process.

Figure 12B:
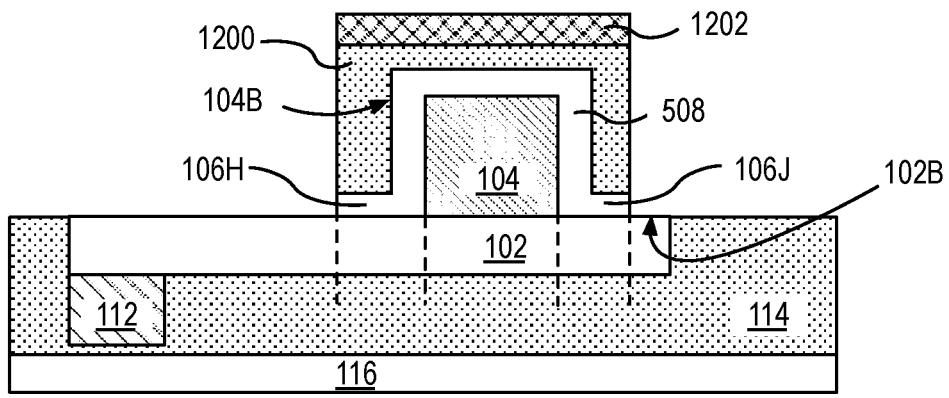
FIG. 12B illustrates the structure of FIG. 12A following an etch process to pattern the fourth dielectric and portions of the dielectric spacer.

FIG. 12B is a cross-sectional illustration of the structure in FIG. 12A following a patterning process to etch the dielectric 1200 and portions of the spacer not covered by the mask 1202. In the illustrative embodiment, the etch process forms lateral extensions of the dielectric spacer layer 508. A lateral extension 106H is formed adjacent to MTJ sidewall 104B and a lateral spacer extension 106J is formed adjacent to MTJ sidewall 104A as shown. As discussed above (in association with FIG. 1H) lateral spacer extensions 106J and 106H are in contact with the spin orbit electrode 102 and need not be equal in lateral extent. Lateral spacer extensions 106H and 106J leaves a portion of the spin orbit electrode top surface 102B exposed.

Figure 12C:
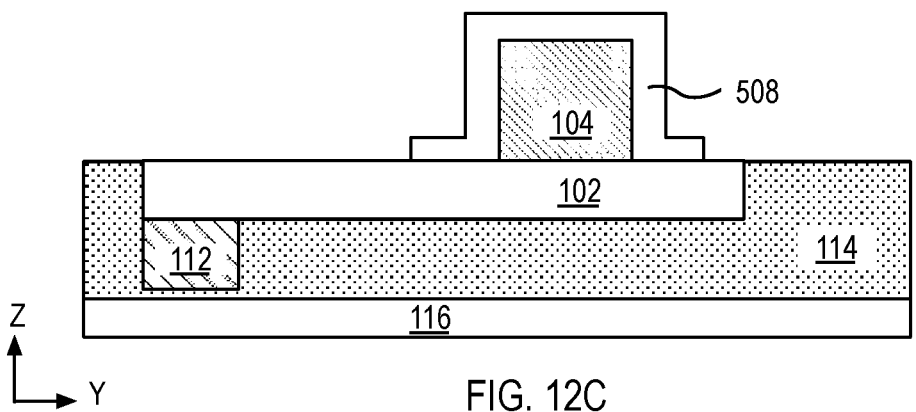
FIG. 12C illustrates the structure of FIG. 12B following removal of the fourth dielectric and the mask.

FIG. 12C is a cross-sectional illustration of the structure in FIG. 12B following the removal of mask 1202 and dielectric 1200 selectively to the dielectric 114, spin orbit electrode 102 and dielectric spacer layer 508.

Figure 12D:
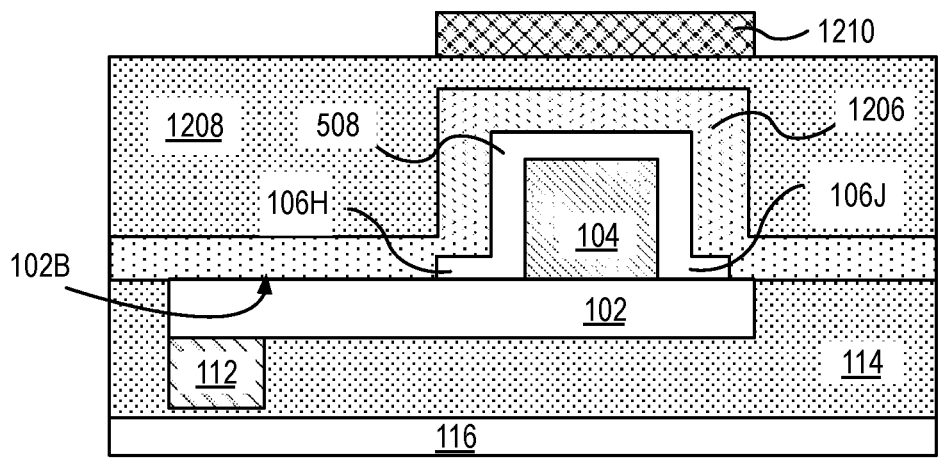
FIG. 12D illustrates the structure of FIG. 12C following the formation of a layer including a selector material on the dielectric spacer and on exposed portions of the electrode, following the formation of a fifth dielectric on the layer of selector material and a mask on the fifth dielectric.

FIG. 12D illustrates the structure of FIG. 12C following the formation of a layer of selector material 1206 on the dielectric spacer layer 508 and on exposed uppermost surface 102B of the spin orbit electrode 102. A dielectric 1208 is formed on the layer of selector material 1206 and a mask 1210 on the dielectric 1208. In an embodiment, the layer of selector material 1206 is blanket deposited onto the dielectric spacer layer 508, on the spin orbit electrode 102 and on the dielectric 114. In an embodiment, the selector element material 1206 is deposited using a reactive sputtering, magnetron sputtering or an atomic layer deposition process. In an embodiment, the selector element material 1206 includes a material that is the same or substantially the same as the material of the selector element 108. The dielectric 1208 is blanket deposited on the selector element material 1206. In an embodiment, the dielectric 1208 may be deposited by a PECVD, CVD or a PVD process and includes silicon and at least one of oxygen, nitrogen or carbon. In an embodiment, after deposition the dielectric 1208 is planarized. In the illustrative embodiment, the CMP process does not expose the layer of selector element material 1206. In the illustrative embodiment, a portion of dielectric 1208 remains on the selector material 1206 above the MTJ 104 after the CMP process.

After planarization a mask 1210 is formed on the dielectric 1208. The mask 1202 extends over the lateral spacer extensions 106J and 106H. In some embodiments, the mask 1210 is formed by a lithographic process and includes a photoresist material.

Figure 12E:
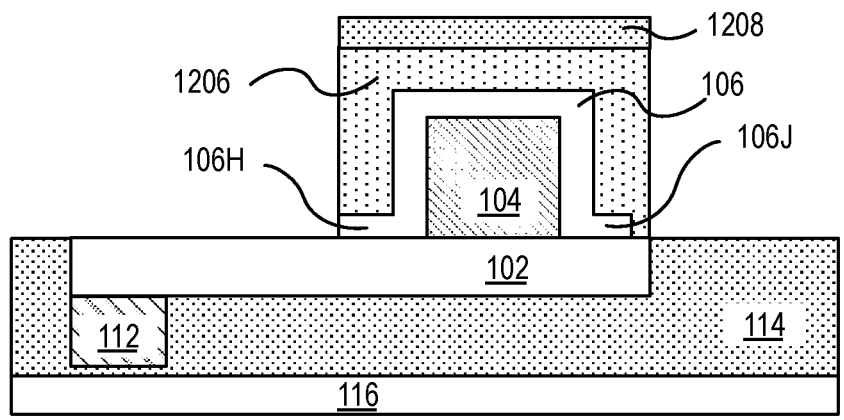
FIG. 12E illustrates the structure of FIG. 12D following an etch process to pattern the fourth dielectric and portions of the layer of selector material.

FIG. 12E illustrates the structure of FIG. 12D following an etch process to pattern the dielectric 1208 and portions of the layer of selector material 1206. The lateral spacer extension 106H is between the layer of selector material 1206 and the spin orbit electrode 102. A portion of the layer of selector material 1206 extends beyond the lateral spacer extension 106J and is in contact with the spin orbit electrode 102 as shown.

Figure 12F:
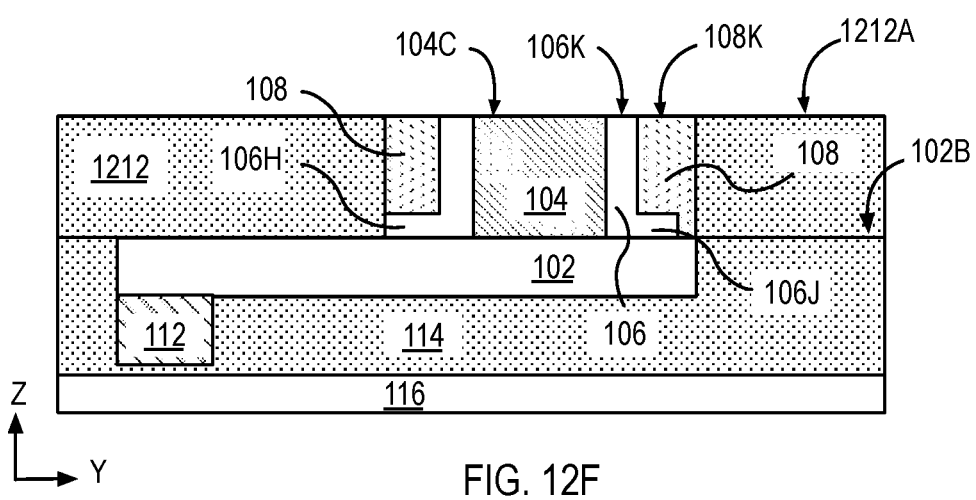
FIG. 12F illustrates the structure of FIG. 12E following a planarization and removal of a sixth dielectric deposited on the selector, on portions of the electrode and on the second dielectric and following the formation of a selector element adjacent to the dielectric spacer.

FIG. 12F illustrates the structure of FIG. 12E following the formation of a selector 108 and formation of a dielectric 1212 adjacent to the selector. In an embodiment, the dielectric 1212 is deposited on the structure of FIG. 12E. For example, the dielectric 1212 is blanket deposited on portions of the uppermost surface 102B of the spin orbit electrode 102, on the dielectric 1208, on sidewalls of the selector element material 1206 and on sidewalls of lateral spacer extension 106H. The dielectric 1212 is not deposited adjacent to the lateral spacer extension 106J.

In an embodiment, after deposition process, the dielectric 1212 is planarized. In the illustrative embodiment, the CMP process removes the excess dielectric 1212 and the dielectric 1208. The CMP process is continued until portion of the layer of selector material and a portion of the dielectric spacer layer above the MTJ 104 are removed. The CMP process forms a selector element 108 adjacent to a spacer 106.

In the illustrative embodiment, the uppermost surface 104C of the MTJ 104, uppermost surface 106K of the spacer 106, uppermost surface 108K of the selector element 108 and uppermost surface 1212A of the dielectric 1212 are co-planar or substantially co-planar after the planarization process.

A shared conductive interconnect may be formed on the MTJ 104 and on the selector element 108 using techniques described in FIGS. 11A and 11B.

Figure 13:
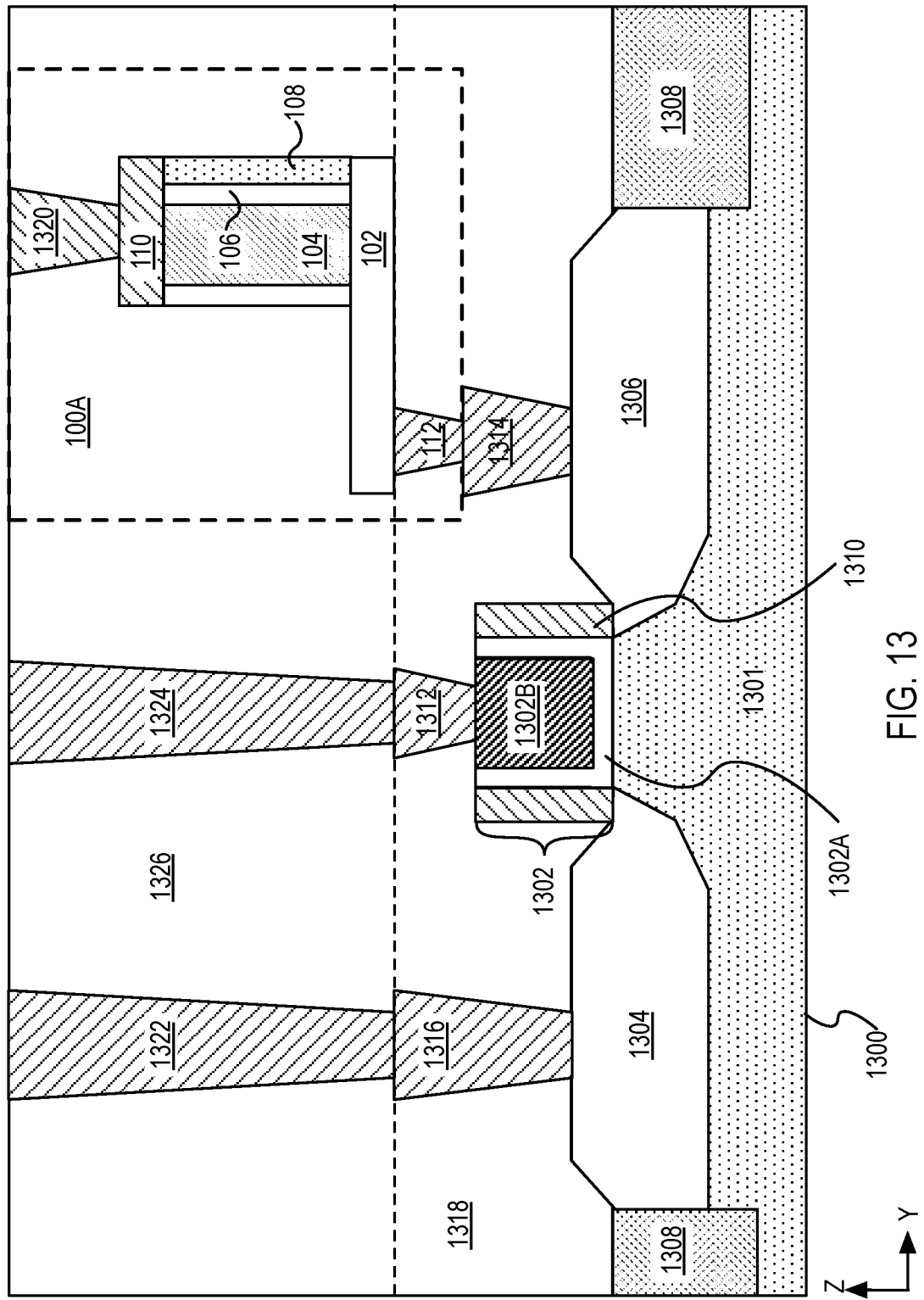
FIG. 13 illustrates a cross-sectional view of a SOT memory device coupled to a transistor.

FIG. 13 illustrates a two-terminal spin orbit memory device such as spin orbit memory device 100A coupled to an access transistor 1300.

In an embodiment, the transistor 1300 is on a substrate 1301 and has a gate 1302, a source region 1304, and a drain region 1306. In the illustrative embodiment, an isolation 1308 is adjacent to the source region 1304, drain region 1306 and portions of the substrate 1301. In some implementations of the disclosure, such as is shown, a pair of sidewall spacers 1310 are on opposing sides of the gate 1302.

The transistor 1300 further includes a gate contact 1312 above and electrically coupled to the gate 1302, and a drain contact 1314 above and electrically coupled to the drain region 1306, and a source contact 1316 above and electrically coupled to the source region 1304, as is illustrated in FIG. 13. The transistor 1300 also includes dielectric 1318 adjacent to the gate 1302, source region 1304, drain region 1306, isolation 1308, sidewall spacers 1310, gate contact 1312, drain contact 1314 and source contact 1316.

In an embodiment, the spin orbit memory device 100A is a two terminal perpendicular spin orbit memory device 100A with one or more structural and material properties described above in FIG. 1A. In the illustrative embodiment, the spin orbit memory device 100A includes spin orbit electrode 102, a magnetic junction 104 on a portion of the spin orbit electrode 102 and spacer 106 on a portion of the first electrode 102. The spin orbit memory device 100A further includes selector element 108 on a portion of the spin orbit electrode 102 as shown. The spin orbit electrode 102 is coupled with the conductive interconnect 112 below and adjacent to dielectric 1318. The conductive interconnect 112 is laterally distant from magnetic junction 104.

In the illustrative embodiment, the conductive interconnect 112 is on and above with the drain contact 1314. In the illustrative embodiment, one portion of the spin orbit electrode 102 is in electrical contact with a drain contact 1314 of transistor 1300 through the conductive interconnect 112. In other embodiments, there are one or more additional interconnect structures between drain contact 1314 and conductive interconnect 112.

As shown, the conductive interconnect 112 is laterally between the selector element 108 and the gate contact 1312. In other embodiments, the selector element 108 is between the conductive interconnect 112 and the gate contact 1312. In some such embodiments, the MTJ 104 is between the selector element 108 and the conductive interconnect 112.

Conductive interconnect 110 is coupled with each of the magnetic junction 104 and the selector element 108. Conductive interconnect 110 is in contact with conductive interconnect 1320, as shown. Conductive interconnect 1320 may be connected to one or more circuit elements.

In other embodiments, perpendicular spin orbit memory devices such as perpendicular spin orbit memory device having one or more features of spin orbit memory device 100B, 100C or 100D may be coupled with the transistor 1300.

Gate contact 1312 and source contact 1316 are each coupled with interconnects. In the illustrative embodiment, gate contact 1312 is coupled with a source interconnect 1322 and the source contact 1316 is coupled with a gate interconnect 1324. A dielectric 1326 is adjacent to source interconnect 1322, gate interconnect 1324, memory device 100A, source contact 1316 and gate contact 1312.

In an embodiment, the underlying substrate 1301 represents a surface used to manufacture integrated circuits. Suitable substrate 1301 includes a material such as single crystal silicon, polycrystalline silicon and silicon on insulator (SOI), as well as substrates formed of other semiconductor materials. In some embodiments, the substrate 1301 is the same as or substantially the same as the substrate 116. The substrate 1301 may also include semiconductor materials, metals, dielectrics, dopants, and other materials commonly found in semiconductor substrates.

In an embodiment, the transistor 1300 associated with substrate 1301 are metal-oxide-semiconductor field-effect transistors (MOSFET or simply MOS transistors), fabricated on the substrate 1301. In some embodiments, the transistor 1300 is an access transistor 1300. In various implementations of the disclosure, the transistor 1300 may be planar transistors, nonplanar transistors, or a combination of both. Nonplanar transistors include FinFET transistors such as double-gate transistors and tri-gate transistors, and wrap-around or all-around gate transistors such as nanori16bon and nanowire transistors.

In some embodiments, gate 1302 includes at least two layers, a gate dielectric layer 1302A and a gate electrode 1302B. The gate dielectric layer 1302A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1302A to improve its quality when a high-k material is used.

The gate electrode 1302B of the access transistor 1300 of substrate 1301 is formed on the gate dielectric layer 1302A and may consist of at least one P-type work function metal or N-type work function metal, depending on whether the transistor is to be a PMOS or an NMOS transistor. In some implementations, the gate electrode 1302B may consist of a stack of two or more metal layers, where one or more metal layers are work function metal layers and at least one metal layer is a conductive fill layer.

For a PMOS transistor, metals that may be used for the gate electrode 1302B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1302B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1302B may consist of one or more U-shaped metal layers formed atop one or more planar, non-U-shaped layers.

The sidewall spacers 1310 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1304 and drain region 1306 are formed within the substrate adjacent to the gate stack of each MOS transistor. The source region 1304 and drain region 1306 are generally formed using either an implantation/diffusion process or an etching/deposition process. In the former process, dopants such as boron, aluminum, antimony, phosphorous, or arsenic may be ion-implanted into the substrate to form the source region 1304 and drain region 1306. An annealing process that activates the dopants and causes them to diffuse further into the substrate typically follows the ion implantation process. In the latter process, the substrate 1301 may first be etched to form recesses at the locations of the source and drain regions. An epitaxial deposition process may then be carried out to fill the recesses with material that is used to fabricate the source region 1304 and drain region 1306. In some implementations, the source region 1304 and drain region 1306 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1304 and drain region 1306 may be formed using one or more alternate semiconductor materials such as germanium or a group III-V material or alloy. And in further embodiments, one or more layers of metal and/or metal alloys may be used to form the source region 1304 and drain region 1306.

In an embodiment, the source contact 1316, the drain contact 1314 and gate contact 1312 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 1308 and dielectric 1318 and 1326 may each include any material that has sufficient dielectric strength to provide electrical isolation such as, but not, limited silicon dioxide, silicon nitride, silicon oxynitride, carbon doped nitride and carbon doped oxide.

Figure 14:
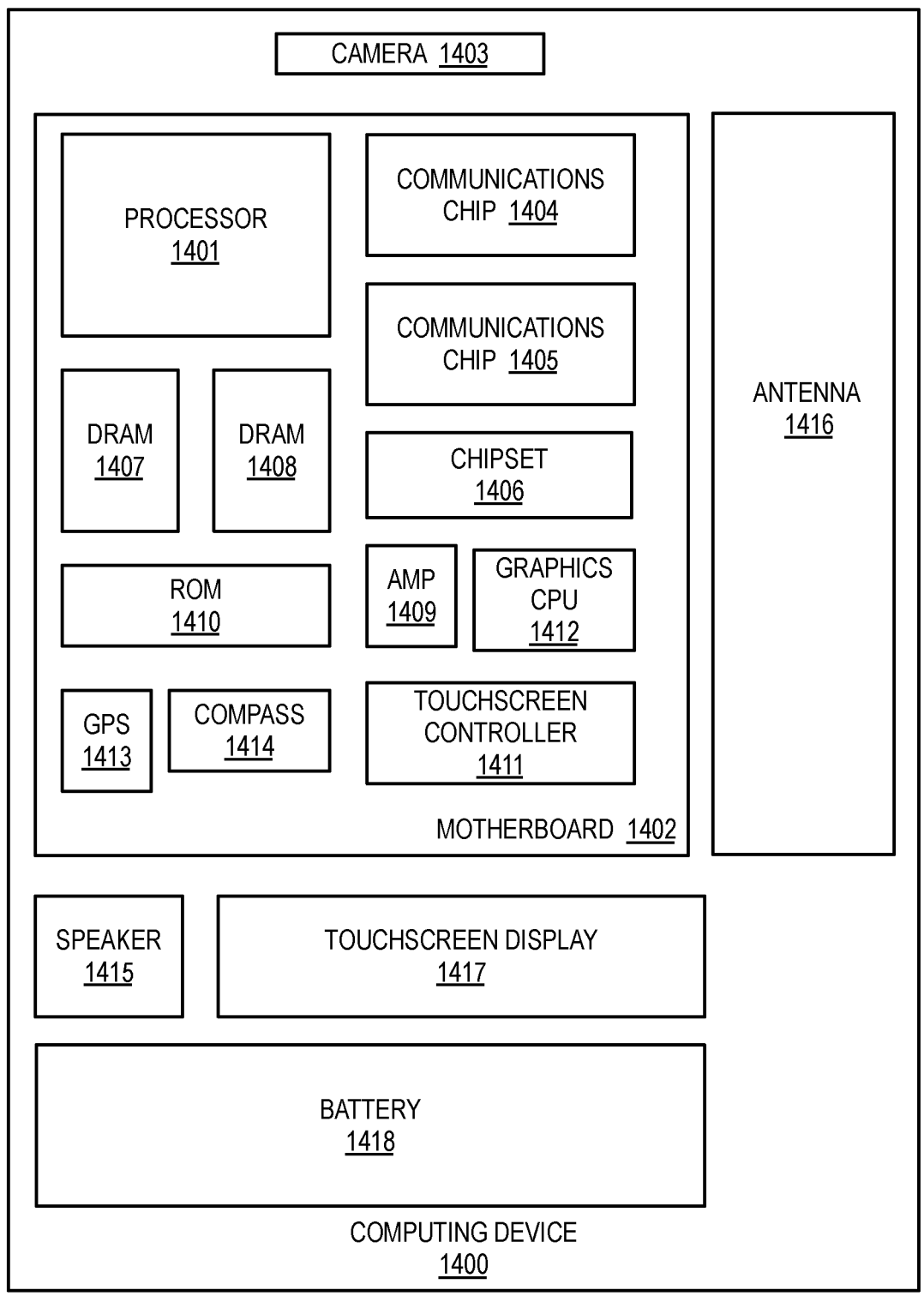
FIG. 14 illustrates a computing device in accordance with embodiments of the present disclosure.

FIG. 14 illustrates a computing device 1400 in accordance with embodiments of the present disclosure. As shown, computing device 1400 houses a motherboard 1402. Motherboard 1402 may include a number of components, including but not limited to a processor 1401 and at least one communications chip 1404 or 1405. Processor 1401 is physically and electrically coupled to the motherboard 1402. In some implementations, communications chip 1405 is also physically and electrically coupled to motherboard 1402. In further implementations, communications chip 1405 is part of processor 1401.

Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset 1406, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1405 enables wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1405 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1400 may include a plurality of communications chips 1404 and 1405. For instance, a first communications chip 1405 may be dedicated to shorter range wireless communications such as Wi-Fi and Bluetooth and a second communications chip 1404 may be dedicated to longer range wireless communications such as GPS, EDGE, GPRS, CDMA, WiMAX, LTE, Ev-DO, and others.

Processor 1401 of the computing device 1400 includes an integrated circuit die packaged within processor 1401. In some embodiments, the integrated circuit die of processor 1401 includes one or more transistors, interconnect structures, non-volatile memory devices, conductive structures and metallization structures such as transistor 1300 coupled with memory device 100A such as is described above. The term "processor" may refer to any device or portion of a device that processes electronic data from registers and/or memory to transform that electronic data into other electronic data that may be stored in registers and/or memory.

Communications chip 1405 also includes an integrated circuit die packaged within communication chip 1405. In another embodiment, the integrated circuit die of communications chips 1404, 1405 includes one or more one or more transistors, interconnect structures, non-volatile memory devices, conductive structures and metallization structures such as transistor 1300 coupled with memory device 100A such as is described above.

Depending on its applications, computing device 1400 may include other components that may or may not be physically and electrically coupled to motherboard 1402. These other components may include, but are not limited to, volatile memory (e.g., DRAM) 1407, 1408, non-volatile memory (e.g., ROM) 1410, a graphics CPU 1412, flash memory, global positioning system (GPS) device 1413, compass 1414, a chipset 1406, an antenna 1416, a power amplifier 1409, a touchscreen controller 1411, a touchscreen display 1417, a speaker 1415, a camera 1403, and a battery 1418, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1400 and discussed above may contain a stand-alone integrated circuit memory die that includes one or more arrays of non-volatile memory devices including one or more memory devices 100A, 100B or 100C each coupled with a transistor such as transistor 1300 described above.

In various implementations, the computing device 1400 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Figure 15:
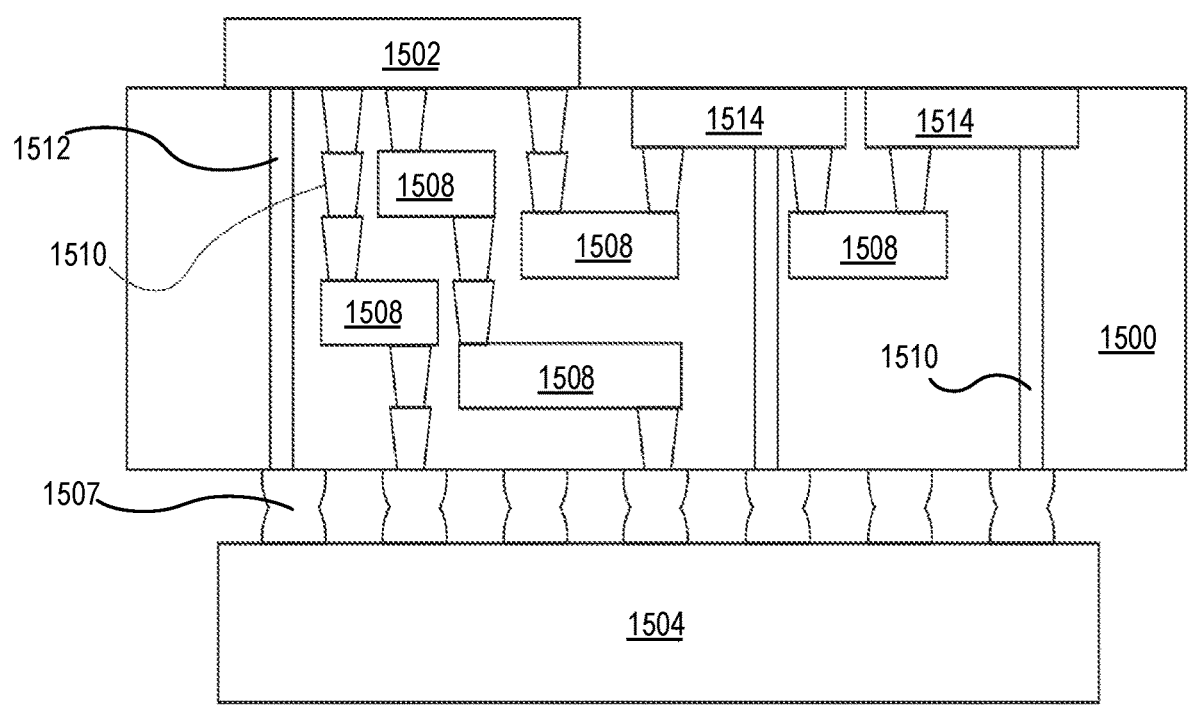
FIG. 15 illustrates an integrated circuit (IC) structure that includes one or more embodiments of the present disclosure.

FIG. 15 illustrates an integrated circuit (IC) structure 1500 that includes one or more embodiments of the disclosure. The integrated circuit (IC) structure 1500 is an intervening substrate used to bridge a first substrate 1502 to a second substrate 1504. The first substrate 1502 may be, for instance, an integrated circuit die. The second substrate 1504 may be, for instance, a memory module, a computer mother, or another integrated circuit die. Generally, the purpose of an integrated circuit (IC) structure 1500 is to spread a connection to a wider pitch or to reroute a connection to a different connection. For example, an integrated circuit (IC) structure 1500 may couple an integrated circuit die to a ball grid array (BGA) 1507 that can subsequently be coupled to the second substrate 1504. In some embodiments, the first and second substrates 1502/1504 are attached to opposing sides of the integrated circuit (IC) structure 1500. In other embodiments, the first and second substrates 1502/1504 are attached to the same side of the integrated circuit (IC) structure 1500. And in further embodiments, three or more substrates are interconnected by way of the integrated circuit (IC) structure 1500.

The integrated circuit (IC) structure 1500 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1508 and vias 1510, including but not limited to through-silicon vias (TSVs) 1512. The integrated circuit (IC) structure 1500 may further include embedded devices 1514, including both passive and active devices. Such devices 1514 include, but are not limited to, capacitors, decoupling capacitors, resistors, inductors, fuses, diodes, transformers, device structure including transistors, such as transistors 1300 (described in FIG. 13) coupled with a with one at least one memory device such as the memory device 100A having a spin orbit electrode coupled with a selector element and a magnetic junction, in accordance with an embodiment of the present disclosure. The integrated circuit (IC) structure 1500 may further include embedded devices 1514 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1500. In accordance with embodiments of the present disclosure, apparatuses or processes disclosed herein may be used in the fabrication of integrated circuit (IC) structure 1500.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit memory device such as the spin orbit memory device 100A having a magnetic tunnel junction and a selector element on a spin orbit electrode. The memory device 100A may be used in an embedded non-volatile memory application.

Thus, embodiments of the present disclosure include spin orbit memory device and methods of fabrication.

In a first example, a memory device includes a first electrode including a spin-orbit material, a magnetic junction on a portion of the first electrode, and a first structure including a dielectric on a portion of the first electrode. The first structure has a first sidewall and a second sidewall opposite to the first sidewall, where the first sidewall is adjacent to a sidewall of the magnetic junction. The memory device further includes a second structure on a portion of the first electrode, where the second structure has a sidewall adjacent to the second sidewall of the first structure. The memory device further includes a first conductive interconnect above and coupled with each of the magnetic junction and the second structure. The memory device further includes a second conductive interconnect below and coupled with the first electrode, where the second conductive interconnect is laterally distant from the magnetic junction and the second structure.

In second examples, for any of the first example, the second structure includes oxygen and at least one of niobium or vanadium.

In third examples, for any of the first through second examples, the second structure has a lateral thickness, between 5 nm and 30 nm, as measured along a first direction from the second sidewall of the first structure.

In fourth examples, for any of the first through third examples, the first electrode has a first dimension along a first direction, the magnetic junction has a second dimension along the first direction, wherein the first structure has a third dimension along the first direction and the second structure has a fourth dimension along the first direction, and wherein the first dimension is greater than a combined sum of the second dimension, fourth dimension and two times the third dimension.

In fifth examples, for any of the first through fourth examples, the first dimension is between 30 nm and 500 nm, wherein the second dimension is between 10 nm and 50 nm, wherein the third dimension is between 2 nm and 5 nm, and wherein the fourth dimension is between 5 nm and 30 nm.

In sixth examples, for any of the first through fifth examples, the first electrode has a fifth dimension along a second direction, wherein the second direction is substantially orthogonal to the first direction, wherein the magnetic junction has a sixth dimension along the second direction, and wherein the fifth dimension is substantially equal to the sixth dimension.

In seventh examples, for any of the first through sixth examples, the first electrode has a fifth dimension along a second direction, wherein the second direction is substantially orthogonal to the first direction, wherein the magnetic junction has a sixth dimension along the second direction, and wherein the sixth dimension is less than the fifth dimension.

In eighth examples, for any of the first through seventh examples, the second structure extends beyond a sidewall of the first electrode along a first direction.

In ninth examples, for any of the first through eighth examples, wherein the second structure extends beyond a second sidewall of the first electrode in a second direction, and wherein the second sidewall of the first electrode is substantially orthogonal to the first sidewall.

In tenth examples, for any of the first through ninth examples, the second conductive interconnect is laterally distant from a sidewall of the magnetic junction by at least 3 nm.

In eleventh examples, for any of the first through tenth examples, a portion of the second structure is between the magnetic junction and the second conductive interconnect, and wherein the portion of the second structure does not extend over the second conductive interconnect.

In twelfth examples, for any of the first through eleventh examples, wherein the second structure has a threshold turn-on voltage that is less than or equal to 0.6V.

In thirteenth examples, for any of the first through twelfth examples, wherein the first structure includes silicon and one or more of oxygen or nitrogen, or a compound of hafnium and oxygen.

In fourteenth examples, for any of the first through thirteenth examples, the magnetic junction includes a first magnet with a first magnetization, a second magnet with a second magnetization, wherein the second magnet is above the second magnet and a layer in direct contact between the first magnet and the second magnet.

In a fifteenth example, a memory device includes a first electrode including a spin-orbit material, a magnetic junction on a portion of the first electrode and a first structure on a portion of the first electrode. The first structure includes a first portion adjacent to a first sidewall of the magnetic junction, a first lateral extension adjacent to the first portion along a first direction, a second portion adjacent to a second sidewall of the magnetic junction, where the second sidewall is opposite to the first sidewall and a second lateral extension adjacent to the second portion along a second direction opposite to the first direction. The memory device further includes a second structure adjacent to the first structure. The second structure includes a first sidewall portion adjacent to the first portion of the first structure, where the first sidewall portion is on the first lateral extension and on a portion of the first electrode and a second sidewall portion adjacent to the second portion of the first structure, wherein the second portion is on the second lateral extension but not on the first electrode.

In sixteenth examples, for any of the fifteenth example, the second structure includes oxygen and at least one of niobium or vanadium.

In seventeenth examples, for any of the fifteenth through sixteenth examples, the first lateral extension has a lateral thickness along the first direction that is less than a lateral thickness along the second direction of the second lateral extension.

In eighteenth examples, for any of the thirteenth through seventeenth examples, the first sidewall portion has a lateral thickness along the first direction that is substantially the same as a lateral thickness of the second sidewall portion along the second direction.

In a nineteenth example, a system includes a processor including at least a transistor above a substrate. The transistor includes a drain contact coupled to a drain, a source contact coupled to a source and a gate contact coupled to a gate. The system further includes a memory device coupled with the drain contact. The memory device includes a first electrode including a spin-orbit material, a magnetic junction on a portion of the first electrode, a first structure including a dielectric on a portion of the first electrode. The first structure has a first sidewall and a second sidewall opposite to the first sidewall, where the first sidewall is adjacent to a sidewall of the magnetic junction. The memory device further includes a second structure on a portion of the first electrode, where the second structure has a sidewall adjacent to the second sidewall of the first structure. The memory device further includes a first conductive interconnect above and coupled with each of the magnetic junction and the second structure and a second conductive interconnect below and coupled with the first electrode, the second conductive interconnect laterally distant from the magnetic junction and the second structure.

In twentieth examples, for any of the nineteenth example, further includes a battery coupled to power at least one of the processor or memory.

What is claimed is:

1. A memory device comprising:
   a first electrode comprising a spin-orbit material;
   a magnetic junction on a portion of the first electrode;
   a first structure comprising a dielectric on a portion of the first electrode, the first structure having a first sidewall and a second sidewall opposite to the first sidewall, wherein the first sidewall is adjacent to a sidewall of the magnetic junction;
   a second structure on a portion of the first electrode, the second structure having a sidewall adjacent to the second sidewall of the first structure;
   a first conductive interconnect above and coupled with each of the magnetic junction and the second structure; and
   a second conductive interconnect below and coupled with the first electrode, wherein the second conductive interconnect is laterally distant from the magnetic junction and the second structure.

2. The memory device of claim 1, wherein the second structure comprises oxygen and at least one of niobium or vanadium.

3. The memory device of claim 1, wherein the second structure has a lateral thickness, between 5 nm and 30 nm, as measured along a first direction from the second sidewall of the first structure.

4. The memory device of claim 1, wherein the first electrode has a first dimension along a first direction, the magnetic junction has a second dimension along the first direction, wherein the first structure has a third dimension along the first direction and the second structure has a fourth dimension along the first direction, and wherein the first dimension is greater than a combined sum of the second dimension, fourth dimension and two times the third dimension.

5. The memory device of claim 4, wherein the first dimension is between 30 nm and 500 nm, wherein the second dimension is between 10 nm and 50 nm, wherein the third dimension is between 2 nm and 5 nm, and wherein the fourth dimension is between 5 nm and 30 nm.

6. The memory device of claim 5, wherein the first electrode has a fifth dimension along a second direction, wherein the second direction is substantially orthogonal to the first direction, wherein the magnetic junction has a sixth dimension along the second direction, and wherein the fifth dimension is substantially equal to the sixth dimension.

7. The memory device of claim 5, wherein the first electrode has a fifth dimension along a second direction, wherein the second direction is substantially orthogonal to the first direction, wherein the magnetic junction has a sixth dimension along the second direction, and wherein the sixth dimension is less than the fifth dimension.

8. The memory device of claim 1, wherein the second structure extends beyond a first sidewall of the first electrode along a first direction.

9. The memory device of claim 8, wherein the second structure extends beyond a second sidewall of the first electrode in a second direction, and wherein the second sidewall of the first electrode is substantially orthogonal to the first sidewall of the first electrode.

10. The memory device of claim 1, wherein the second conductive interconnect is laterally distant from a sidewall of the magnetic junction by at least 3 nm.

11. The memory device of claim 1, wherein a portion of the second structure is between the magnetic junction and the second conductive interconnect.

12. The memory device of claim 1, wherein the second structure has a threshold turn-on voltage that is less than or equal to 0.6V.

13. The memory device of claim 1, wherein the first structure comprises silicon and one or more of oxygen or nitrogen, or a compound of hafnium and oxygen.

14. The memory device of claim 1, wherein the magnetic junction comprises:
    a first magnet with a first magnetization;
    a second magnet with a second magnetization, wherein the second magnet is above the first magnet; and
    a layer in direct contact between the first magnet and the second magnet.

15. A memory device comprising:
    a first electrode comprising a spin-orbit material;
    a magnetic junction on a portion of the first electrode;
    a first structure on a portion of the first electrode, the first structure comprising:
       a first portion adjacent to a first sidewall of the magnetic junction;
       a first lateral extension adjacent to the first portion along a first direction;
       a second portion adjacent to a second sidewall of the magnetic junction, wherein the second sidewall is opposite to the first sidewall; and
       a second lateral extension adjacent to the second portion along a second direction opposite to the first direction; and
    a second structure adjacent to the first structure, the second structure comprising:
       a first sidewall portion adjacent to the first portion of the first structure, wherein the first sidewall portion is on the first lateral extension and on a portion of the first electrode; and
       a second sidewall portion adjacent to the second portion of the first structure, wherein the second portion is on the second lateral extension but not on the first electrode.

16. The memory device of claim 15, wherein the second structure comprises oxygen and at least one of niobium or vanadium.

17. The memory device of claim 15, wherein the first lateral extension has a lateral thickness along the first direction that is less than a lateral thickness along the second direction of the second lateral extension.

18. The memory device of claim 15, wherein the first sidewall portion has a lateral thickness along the first direction that is substantially the same as a lateral thickness of the second sidewall portion along the second direction.

19. A system comprising:
    a processor comprising at least a transistor above a substrate, the transistor comprising:
       a drain contact coupled to a drain;

a source contact coupled to a source; and
a gate contact coupled to a gate; and
a memory device coupled with the drain contact, the memory device comprising:
a first electrode comprising a spin-orbit material;
a magnetic junction on a portion of the first electrode;
a first structure comprising a dielectric on a portion of the first electrode, the first structure having a first sidewall and a second sidewall opposite to the first sidewall, wherein the first sidewall is adjacent to a sidewall of the magnetic junction;
a second structure on a portion of the first electrode, the second structure having a sidewall adjacent to the second sidewall of the first structure;
a first conductive interconnect above and coupled with each of the magnetic junction and the second structure; and
a second conductive interconnect below and coupled with the first electrode, the second conductive interconnect laterally distant from the magnetic junction and the second structure.

20. The system of claim 19, further comprising a battery coupled to power at least one of the processor or memory.

* * * * *